US006857094B2

(12) United States Patent
Shigeta

(10) Patent No.: US 6,857,094 B2
(45) Date of Patent: Feb. 15, 2005

(54) METHOD AND SYSTEM FOR INFERRING FAULT PROPAGATION PATHS IN COMBINATIONAL LOGIC CIRCUIT

(75) Inventor: Kazuki Shigeta, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 501 days.

(21) Appl. No.: 10/073,389

(22) Filed: Feb. 12, 2002

(65) Prior Publication Data

US 2002/0112207 A1 Aug. 15, 2002

(30) Foreign Application Priority Data

Feb. 15, 2001 (JP) ......................................... 2001-038875
Nov. 26, 2001 (JP) ......................................... 2001-359012

(51) Int. Cl.[7] ............................................. G01R 31/28
(52) U.S. Cl. ........................................................ 714/736
(58) Field of Search ................................ 714/724, 726, 714/736, 25

(56) References Cited

U.S. PATENT DOCUMENTS

| 5,640,403 | A |   | 6/1997 | Ishiyama et al. | ............. | 371/26 |
| 5,968,195 | A |   | 10/1999 | Ishiyama | .................... | 714/727 |
| 6,195,773 | B1 | * | 2/2001 | Wada | ......................... | 714/724 |
| 6,301,685 | B1 |   | 10/2001 | Shigeta | ....................... | 714/799 |
| 6,385,750 | B1 | * | 5/2002 | Kapur et al. | ................ | 714/738 |
| 6,560,738 | B1 | * | 5/2003 | Shigeta | ....................... | 714/726 |

FOREIGN PATENT DOCUMENTS

| JP | 8-146093 | 6/1996 |
| JP | 10-62494 | 3/1998 |
| JP | 10-154171 | 6/1998 |
| JP | 11-153646 | 6/1999 |

* cited by examiner

*Primary Examiner*—Guy J. Lamarre
*Assistant Examiner*—John P Trimmings
(74) *Attorney, Agent, or Firm*—Foley & Lardner LLP

(57) ABSTRACT

Disclosed is a system for inferring faulty locations in a combinational logic circuit by tracing a fault propagation path from a faulty terminal through repetition of logic decisions and implications. The system infers a logic state by repeating logic state decisions and implications and comparing the logic state with an expected value, which corresponds to a normally operating logic state, thereby inferring a fault propagation path in the logic circuit. The system includes decision-limit discrimination circuitry for providing an upper limit on a decision level that represents a number of logic state decisions and, if the number exceeds the upper limit, for switching the logic state decision to simple retrieval of a fault propagation path, and simple retrieval circuitry for extracting a fan-in cone by tracing a net list of the logic circuit in an input direction from an undetermined gate whose output signal is faulty and whose input/output signal lines have a signal line the logic state of which is unknown, and registering, as fault propagation paths, signal lines which are included in the fan-in cone.

27 Claims, 21 Drawing Sheets

METHOD AND SYSTEM FOR INFERRING FAULT PROPAGATION PATHS IN COMBINATIONAL LOGIC CIRCUIT

FIELD OF THE INVENTION

This invention relates to a fault propagation path inference system and method for finding, at high speed, a path along which it is possible that a fault will propagate in a combinational logic circuit, and to a program for causing a computer to infer a fault propagation path.

BACKGROUND OF THE INVENTION

Fault propagation path inference techniques are used to infer a path along which a fault that satisfies an output pattern inclusive of a faulty output may possibly propagate. For example, such art can be used as part of a system for inferring a faulty location in a sequential circuit, as described in the specification of Japanese Patent Kokai Publication JP-A-8-146093 (U.S. Pat. No. 2,655,105) or Japanese Patent Kokai Publication JP-A-10-62494 (U.S. Pat. No. 2,921,502). The fault may exist in a combinational circuit or the fault state may be included in an input pattern.

An reverse logic expansion system that makes use of backtracking in which Don't Care has been introduced can be utilized as a system for inferring a fault propagation path in the prior art [see the specification of Japanese Patent Kokai Publication JP-A-10-154171 (U.S. Pat. No. 2956624)]. This system extracts a fault propagation path by comparing an input inferred state, which has been found by reverse logical inference, and the logic state obtained in a combinational logic circuit in the process of making the reverse logic expansion, with an expected value obtained in advance by a logic simulation in a normal circuit. In accordance with the method set forth in the specification of Japanese Patent Kokai Publication JP-A-10-154171 (U.S. Pat. No. 2,956,624), it is possible to obtain all input logic states that satisfy output logic states. By making the comparison with the expected value obtained by the logic simulation, it is possible to extract the fault propagation path.

However, a very large number of decisions are made in multiplier circuits and the like and computation time is prolonged significantly.

Accordingly, the specification of Japanese Patent Kokai Publication JP-A-11-153646 proposes a fault propagation path extraction system for speeding up processing by limiting decisions of logic values regarding signal lines to signal lines that are related to a fault propagation path.

The structure of fault propagation path extraction system proposed by the specification of Japanese Patent Kokai Publication JP-A-11-153646 will be described with reference to FIG. 16. This conventional fault propagation path extraction system includes an input unit 1 such as a keyboard, a data processing unit 2 operated under the control of a program, a storage unit 4 such as a hard disk or memory for storing information, and an output unit 5 such as a display unit or printer.

The storage unit 4 has a logic-circuit structure memory 41, a logic contradiction memory 42, a decision state memory 43 and a logic state memory 44.

Previously stored in the logic-circuit structure memory 41 is the constitution of a logic circuit, such as type of gates, connection relationship between gates, connection relationship between gates and signal lines, and connection relationship between signal lines.

The logic contradiction memory 42 stores the gates in which logic contradictions have occurred during implication processing and the number of times logic contradictions have occurred.

The decision state memory 43 stores a decision level representing how many times decisions have been rendered and a decision level at the time when the logic state of each signal line is inferred by implication.

The logic state memory 44 stores the logic state of each signal line undergoing processing, the implication history and the logic state (expected value) of each signal line when a circuit is normal.

The data processing unit 2 has initialization means 21, implication means 22, logic contradiction discrimination means 23, processing-end discrimination means 24, backtrack means 25, undetermined-gate retrieval means 26, retrieval means 27 for retrieving a line influenced by a fault propagation path, logic value decision means 29, logic value comparison means 31 and extraction means 32 for extracting a line related to a fault output terminal.

The initialization means 21 sets the logic-circuit type provided by the input unit 1 and the logic state of an input/output terminal and initializes the logic state of a signal line. The initialization means 21 further initializes the decision level and sets an upper-limit value.

The implication means 22 refers to a logic circuit structure that has been stored in the logic-circuit structure memory 41 and to the logic state of each signal line that has been stored in the logic state memory 44, performs an implication operation in a gate connected to an input/output signal line set by the initialization means 21 and in a gate connected to a signal line decided by the logic value decision means 29, and infers the logic states of input/output signal lines of the gates.

In case where a logic value is inferred anew, the implication means 22 records the logic value and a history of implications in the logic state memory 44 and records a decision level, which indicates under how many decisions the inference was made, in the decision state memory 43.

If a logic contradiction occurs during an implication operation, the implication means 22 refers to the logic contradiction memory 42 and determines whether the number of logic contradictions has exceeded a predetermined allowable number. If the number of logic contradictions is greater than the allowable number, then, in order to improve the inference precision of logic states in the circuit, the implication means 22 may execute processing such as referring to the history of implications stored in the logic-circuit structure memory 41, the logic contradiction memory 42 and logic state memory 44, initializing the logic state of the signal line that is the cause of the logic contradiction and updating the information in the logic contradiction memory 42, decision state memory 43 and logic state memory 44.

The logic contradiction discrimination means 23 refers to the logic contradiction memory 42 and determines whether the number of logic contradictions on a signal line detected by the implication means 22 has exceeded a predetermined allowable number.

The processing-end discrimination means 24 refers to the logic state of each signal line stored in the logic state memory 44 and determines whether the logic states of all signal lines have been inferred.

The backtrack means 25 refers to the state of the decision stored in the decision state memory 43 and to the logic state of a signal line stored in the logic state memory 44, erases the logic state of a decision level for which processing has been completed as well as the history of implications and logic contradictions and returns the logic state of each signal line back to the logic state that prevailed prior to the rendering of the decision.

The undetermined-gate retrieval means 26 examines the logic states of the input/outputs of the gates in the combinational circuit and retrieves gates the logic state of which is incomplete. For example, if the output signal in a NAND gate is "1", one of the input signals is always "0". However, when the logic states of the input signal lines have not been decided and which signal line is "0" is unknown, then the input/output logic state of this gate is incomplete and the gate is an undetermined gate.

The retrieval means 27 that retrieves a line influenced by a fault propagation path refers to the logic circuit structure stored in the logic-circuit structure memory 41 and logic state of each signal line stored in the logic state memory 44 and retrieves an undetermined gate having an output signal for which the fault state has been inferred. This gate is retrieved from undetermined gates that have been retrieved by the undetermined-gate retrieval means 26.

The logic value decision means 29 selects an input signal line of an undetermined gate for which the output signal is faulty, this gate having been detected by the retrieval means 27 that retrieves a line influenced by a fault propagation path, and decides the logic state.

The logic value comparison means 31 compares the obtained logic state of each signal line with an expected value representing the logic state of each signal line found by logic simulation in a normal circuit, and extracts the fault propagation path.

The extraction means 32 extracts, from the fault propagation paths that have been extracted by the logic value comparison means 31, a fault propagation path that will have a direct influence upon a fault output terminal when a fault exists on the path, and outputs data to the output unit 5.

FIG. 17 is a flowchart useful in describing the operation of the fault propagation path extraction system as defined in the prior art. The operation of this system will be described with reference to FIGS. 16, 17 and 18.

The logic state of an input/output terminal provided by the input unit 1 is set in the initialization means 21 to initialize a decision level (dlevel) that represents the number of times a decision is rendered (steps A1 and A2 in FIG. 17).

Next, the implication means 22 performs an implication operation (step A4). The implication is an operation for inferring, from the already inferred logic state of an input/output line of a gate at each gate, the logic state of an input/output line of a gate for which an inference has not yet been made. The implication means 22 retrieves a gate for which an implication operation is possible. Namely, using the function of the gate and the logic state of an input/output line connected to this gate and for which the logic state has been determined, the implication means 22 retrieves a gate for which it is possible to imply the logic state of an input/output line that is connected to the above-mentioned gate and whose logic state has not yet been decided.

The logic state of the input/output signal line at the detected gate is then inferred. The inferred logic state is recorded in the logic-circuit structure memory 41 and is recorded also in the decision state memory 43 together with the decision level at this time and the history of the implication operation.

FIGS. 7a and 7b illustrate a specific example of an implication operation in a two-input NAND gate, in which FIG. 7a shows the result of logic state inference applied to an output signal line in an instance where the logic states of input signal lines of the two-input NAND gate have been decided, and FIG. 7b shows the result of logic state inference applied to the input signal lines in an instance where the logic state of the output signal line of the two-input NAND gate has been decided. In the case of the NAND gate shown in FIG. 7a, it is inferred that the logic state of the output signal line will be "1" if the logic state of even one of the input signal lines is "0", and it is inferred that the logic state of the output signal line will be "0" if the logic states of all input signal lines are "1"s. If the logic state of the output signal line of the two-input NAND gate is "0", as shown in FIG. 7b, it is inferred that the logic states of the input signal lines are all "1"s. If the logic state of the output signal line of the two-input NAND gate is "1" and the logic state of one of the input signal lines is "1", then it is inferred that the logic state of the other input signal line is "0".

The logic contradiction discrimination means 23 refers to the logic contradiction memory 42 to determine whether the number of logic contradictions has exceeded an allowable number (step A5 in FIG. 17).

If the logic contradiction discrimination means 23 finds that the number of contradictions is not greater than the allowable number ("NO" at step A5), then the processing-end discrimination means 24 refers to the signal-line logic states that have been stored in the logic state memory 44 and determines whether the logic states of all signal lines have been inferred to be "0", "1" or "X" (step A6). If the number of contradictions is greater than the allowable number ("YES" at step A5), this means that a fault propagation path will not be found by the present decision and, hence, control proceeds to the processing of step A14.

If it is determined that the inferring of the logic states of all signals lines is not finished ("NO" at step A6), then the undetermined-gate retrieval means 26 examines the input/output logic states of the gates in the combinational circuit and retrieves undetermined gates for which the logic state is incomplete (step A7).

Next, the retrieval means 27 for retrieving a line influenced by a fault propagation path refers to the logic circuit structure stored in the logic-circuit structure memory 41 and logic state of each signal line stored in the logic state memory 44 and retrieves an undetermined gate having an output signal for which the fault state has been inferred (step A8). The retrieval is made from undetermined gates retrieved at step A6.

The logic value decision means 29 renders a "0" decision with respect to a detected signal line and increments the decision level (dlevel) that represents the number of times a decision has been rendered (step A10). Control then returns to implication processing (step A4) by the implication means 22.

If the processing-end discrimination means 24 determines at step A6 that the logic states of all signal lines have been inferred ("YES" at step A6), this means that a logic state in the circuit is "0", "1" or "X". Accordingly, the logic value comparison means 31 extracts a signal line whose state is different from that of the expected value, i.e., extracts a fault propagation path (step A12). Furthermore, the extraction means 32 extracts from the fault propagation paths a fault propagation path that will have a direct influence upon a fault output terminal when a fault exists on the path, and outputs this data to the output unit 5 (step A13).

Next, it is determined whether decision processing for both "0" and "1" has been completed with regard to all lines for which decisions have been rendered (step A14). If it is found at step A14 that the logic states of all signal lines have been inferred, then the logic states of signal lines in the combinational logic circuit will have been inferred to be "0", "1" or "X". The processing of step A14 is executed also in a case where a contradiction has been detected by the logic contradiction discrimination means 23.

If the processing-end discrimination means 24 determines that decision processing has not ended ("NO" at step A14), the backtrack means 25 retrieves one decision line, the state of which has not been decided to be "1", from lines having a high decision level, initializes the logic state of a signal line inferred in a decision whose level is higher than that of the decision of the detected decision line and returns the logic state of each signal line to the logic state that prevailed prior to the rendering of this decision (step A15). The logic value decision means 29 decides that the state of the decision line detected by the backtrack means 25 is "1" (step A16), after which control returns to the implication operation (step A4) by the implication means 22.

If the processing-end discrimination means 24 determines that decision processing has ended ("YES" at step A14), then processing for extracting a fault propagation path is exited.

The conventional system for extracting a fault propagation path will be described in detail with reference to FIGS. 16, 17, 8 and 18. A case where this art is applied to a combinational circuit shown in FIG. 8 will be described as a specific example.

Consider a case where the expected values of input/output terminals of gates of interest and the logic values (L22=1, L23=1) of output signals are given as the initial state. Accordingly, L23 is the fault output.

First, the initialization means 21 sets the logic states and expected values of the input/output terminals and signal lines. The initialization means 21 sets the following: L1=X[1], L2=X[1], L3=X[1], L6=X[1], L7=X[1], L22=1[1], L23=1[0]. The numerals enclosed by the brackets represent the expected values.

The initialization means 21 initializes the decision level (dlevel) (step A2 in FIG. 17) and then the implication means 22 finds the logic values of signal lines in the logic circuit at step A4. Here there is no signal line implicated by L22=1, L23=1. Since a logic contradiction does not occur, the logic contradiction discrimination means 23 determines that there is no logic contradiction ("NO" at step A5).

Since a fault propagation path that will cause a fault output at L23 is not found, the processing-end discrimination means 24 determines that processing is not finished ("NO" at step A6) and control proceeds to step A7.

NAND gates G22, G23, for which the output signals are "1" and for which the input signals have not yet been inferred as being "0", are retrieved as undetermined gates by the undetermined-gate retrieval means 26 at step A7.

At step A8 the retrieval means 27 for retrieving a line influenced by a fault propagation path selects L16 as a signal line for which a logic value has not been determined. The selection is made from the input signal lines of gate G23 having the fault signal as its output signal.

The logic value of signal line L16 detected at step A8 is decided to be "0" and the decision level is incremented at step A10.

By virtue of the implication operation performed at step A4, L2=1, L11=1 is implicated at G16 from L16=0.

A logic contradiction is not detected at step A5 and the inferring of logic states is not finished. Control proceeds to step A7 as a result.

Gate G11 is detected as an undetermined gate at step A7. Since a fault signal has been inferred as the output signal of gate G11, the input signal line L3 thereof is selected at step A8.

The logic value of signal line L3 detected at step A8 is decided to be "0" and the decision level is incremented at step A10.

By virtue of the implication operation performed at step A4, L10=1 is implicated at G10 from L3=0.

A logic contradiction is not detected at step A5 and all logic states have been determined. At step A6, therefore, it is determined that the inferring of logic states is finished. Control then proceeds to step A12.

The logic value comparison means 31 extracts a signal line whose state is different from that of the expected value, i.e., extracts a fault propagation path (step A12). As a result, L3, L11, L16 and L23 are extracted as the fault propagation paths.

Furthermore, among the fault propagation paths, L3, L11, L16, L23 are fault propagation paths that have a direct influence upon the fault output terminal when a fault exists on the path. Therefore the extraction means 32 for extracting a line related to a fault outputs these paths to the output unit 5 (step A13).

Since L3 has not been decided to be "1" as a decided line, it is determined at step A14 that processing is not completed and, hence, control proceeds to step A15.

The state that prevailed immediately prior to the decision on L3 is restored by the backtrack means 25. Accordingly, the decision level becomes 1 and the signal lines for which logic values have been decided become L22=1, L23=1, L16=0, L2=1, L11=1 (step A15).

Now a decision to the effect that L3=1 holds is rendered and the decision level becomes dlevel=2 (step A16).

Next, the logic value of the signal line in the logic circuit is found by the implication means 24 at step A4. By virtue of the implication operation at G16, L6=0 is implicated and the logic values of all signals lines are found.

A contradiction is not detected at step A5 and the inferring of logic states ends. Control then proceeds to step A12.

A comparison with expected values is made by the logic value comparison means 31 at step A12, whereby L6, L11, L16 and L23 are extracted as the fault propagation paths.

Since there is a possibility that all of these paths will propagate a fault state to the fault output terminal L23, these paths are output to the output unit 5 (step A13).

By repeating the foregoing processing, all logic states that satisfy L22=1, L23=1 can be found.

FIG. 18 illustrates the above processing in the form of a tree structure. Decisions are rendered for signal lines at two locations, three logic states are found and a fault propagation path corresponding to each state is obtained. The decision level (dlevel) corresponds to the depth of the tree structure, as depicted in FIG. 18.

The conventional system for extracting fault propagation paths finds all fault propagations by repeating logical decisions and implications. However, the circuit is large in scale and, depending upon the faulty locations or input pattern, the number of necessary logical decisions changes significantly. In some cases it is necessary to execute processing of a long period of time ascribable to a large number of decisions.

Although it is possible to suspend processing in mid-course in order that the time needed for inference processing will fall within a practical processing time, there are instances where inference processing will not reach an actual faulty location. In such cases there is the possibility that an actual fault will not be included in a list of fault candidates created on the basis of the fault propagation paths that have been found. The result is a decline in inference precision.

Accordingly, a first problem that arises in the prior art is that there is too much processing for inferring fault propagation paths and the possibility that processing time will become too long. The reason for this is that there are too many logical decisions to be rendered.

A second problem is that the precision with which fault propagation paths are inferred declines if processing is suspended in mid-course. The reason for this is that inference processing will not reach the actual faulty location if processing is suspended, as a consequence of which the fault propagation paths will not include the actual fault.

SUMMARY OF THE DISCLOSURE

Accordingly, it is an object of the present invention to provide a system, method and program for inferring fault propagation paths at high speed.

Another object of the present invention is to provide a system, method and program for inferring fault propagation paths in which it is possible to infer fault propagation paths that include an actual fault even if inference processing is suspended.

At least one of the foregoing objects and other objects is accomplished by a fault propagation path inferring system, in accordance with one aspect of the present invention, which executes inference of a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising: decision-limit discrimination means for providing an upper limit on a decision level that represents a number of logic state decisions and, if the number of logic state decisions exceeds the upper limit on the decision level, switching the logic state decision to simple retrieval of a fault propagation path; and first fault propagation path simple retrieval means for extracting a fan-in cone by tracing a net-list of the combinational logic circuit in an input direction from an undetermined gate whose output signal is faulty and whose input/output signal lines have a signal line the logic state of which is U(unknown), and registering, as a fault propagation path, a signal line, which is included in the fan-in cone, the logic state of which has not been decided.

In accordance with the present invention, the first fault propagation path simple retrieval means includes: unprocessed-gate retrieval means for retrieving an unprocessed gate, which has not undergone simple retrieval of a fault propagation path, from among one or plural undetermined gates whose output signals are faulty and whose input/output signal lines have a signal line the logic state of which is U (unknown); input signal line retrieval means for retrieving a signal line, for which the logic state has not been determined, from among one or plural input signal lines of the unprocessed gate; and fault propagation path registration means for adopting the logic state of the retrieved signal line as a fault state and recording this in a logic state storage unit.

In accordance with the present invention, a fault propagation path inferring system comprises: decision-limit discrimination means for providing an upper limit on a decision level that represents a number of logic state decisions and, if the number of logic state decisions exceeds the upper limit, switching to simple retrieval of a fault propagation path; and second fault propagation path simple retrieval means for tracing, in an input direction, signal lines for which there is a possibility that a fault state will propagate to an undetermined gate, while referring to expected values of signal lines and to gate function, from an undetermined gate whose output signal is faulty and whose input/output signal lines have a signal line the logic state of which is U (unknown), and registering the traced signal lines as fault propagation paths.

In accordance with the present invention, the second fault propagation path simple retrieval means includes: unprocessed-gate retrieval means for retrieving an unprocessed gate, which has not undergone simple retrieval of a fault propagation path, from among one or plural undetermined gates whose output signals are faulty and whose input/output signal lines have a signal line the logic state of which is U (unknown); input signal line retrieval means for retrieving a signal line, for which the logic state has not been determined, from among one or plural input signal lines of the unprocessed gate; fault propagation path discrimination means for retrieving, from the retrieved input signal lines, an input signal line for which there is a possibility that an output logic state of a gate will be made a fault state, by referring to gate function and expected values of gate input/output terminals; and fault propagation path registration means for adopting the logic state of the retrieved signal line as a fault state and registering this signal line in a logic state storage unit.

A system in accordance with another aspect of the present invention comprises: decision-limit altering means for determining whether a predetermined decision-limit reset condition has been satisfied and, if this condition has been satisfied, resetting a decision level that represents a number of logic state decisions and restoring the logic state to a logic state where the number of decisions falls below a decision limit value that has been reset; decision-limit discrimination means for providing an upper limit on the decision level that represents the number of logic state decisions and, if the number of logic state decisions exceeds the upper limit of the decision level, switching the decision of logic states to simple retrieval of fault propagation paths; and the first fault propagation path simple retrieval means or the second fault propagation path simple retrieval means.

In accordance with the present invention, the decision-limit altering means includes: decision-limit reset condition discrimination means for deciding beforehand an upper-limit value on inference processing time as a decision-limit reset condition, and discriminating whether the inference processing time has exceeded the upper limit on inference processing time; decision-limit resetting means for resetting a decision limit value if the decision-limit reset condition has been satisfied; and backtrack means which, if the number of decisions exceeds the decision limit value reset by the decision-limit resetting means, is for erasing the logic state of a decision level for which inference processing has already ended, a history of implications as well as logic contradictions, and restoring the logic state of each signal line to a logic state that prevailed before the number of decisions exceeded the decision limit value.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will be described.

According to the present invention, an upper limit is set on the number of times logic decisions are made. If the number of decisions reaches the upper limit when an inference operation is in progress, a fan-in cone is traced in the input direction from an undetermined gate by simplified retrieval of a fault propagation path and a signal line whose logic state has not been decided within the fan-in cone is registered as a fault propagation path.

Figure 1:
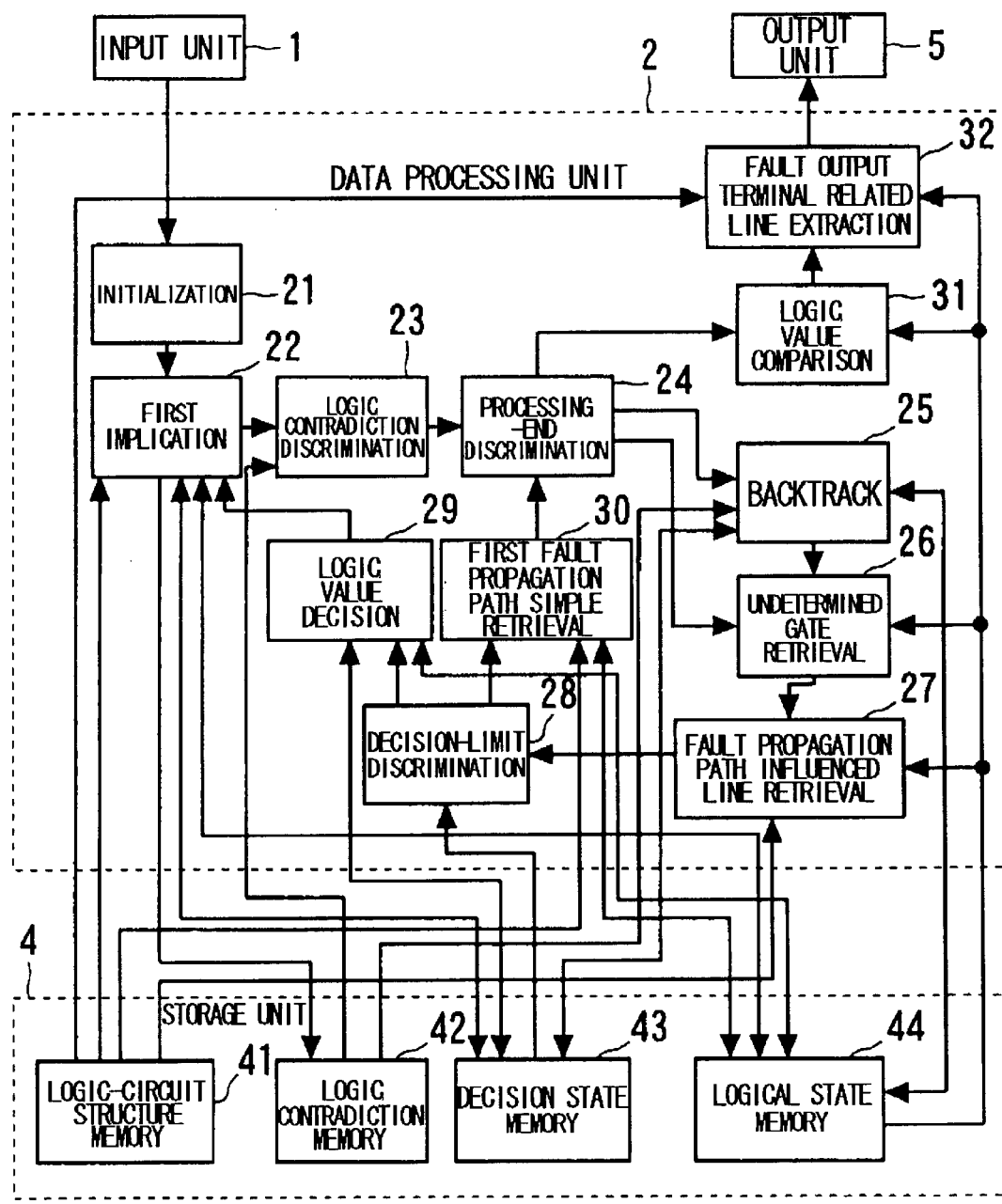
FIG. 1 is a block diagram illustrating the configuration of a system according to a first embodiment of the present invention.

More specifically, a data processing unit (2 in FIG. 1) has decision-limit discrimination means (28 in FIG. 1) and first fault propagation path simple retrieval means (30 in FIG. 1). The first fault propagation path simple retrieval means (30) includes unprocessed-gate retrieval means (301 in FIG. 2), input signal line retrieval means (302 in FIG. 2) and fault propagation path registration means (303 in FIG. 2).

Further, in accordance with the present invention, an upper limit is set on the number of times logic decisions are made. If the number of decisions reaches the upper limit when an inference operation is in progress, a signal line along which there is a possibility that a fault will propagate to an undetermined gate is registered as a fault propagation path by simple fault propagation path retrieval.

Figure 10:
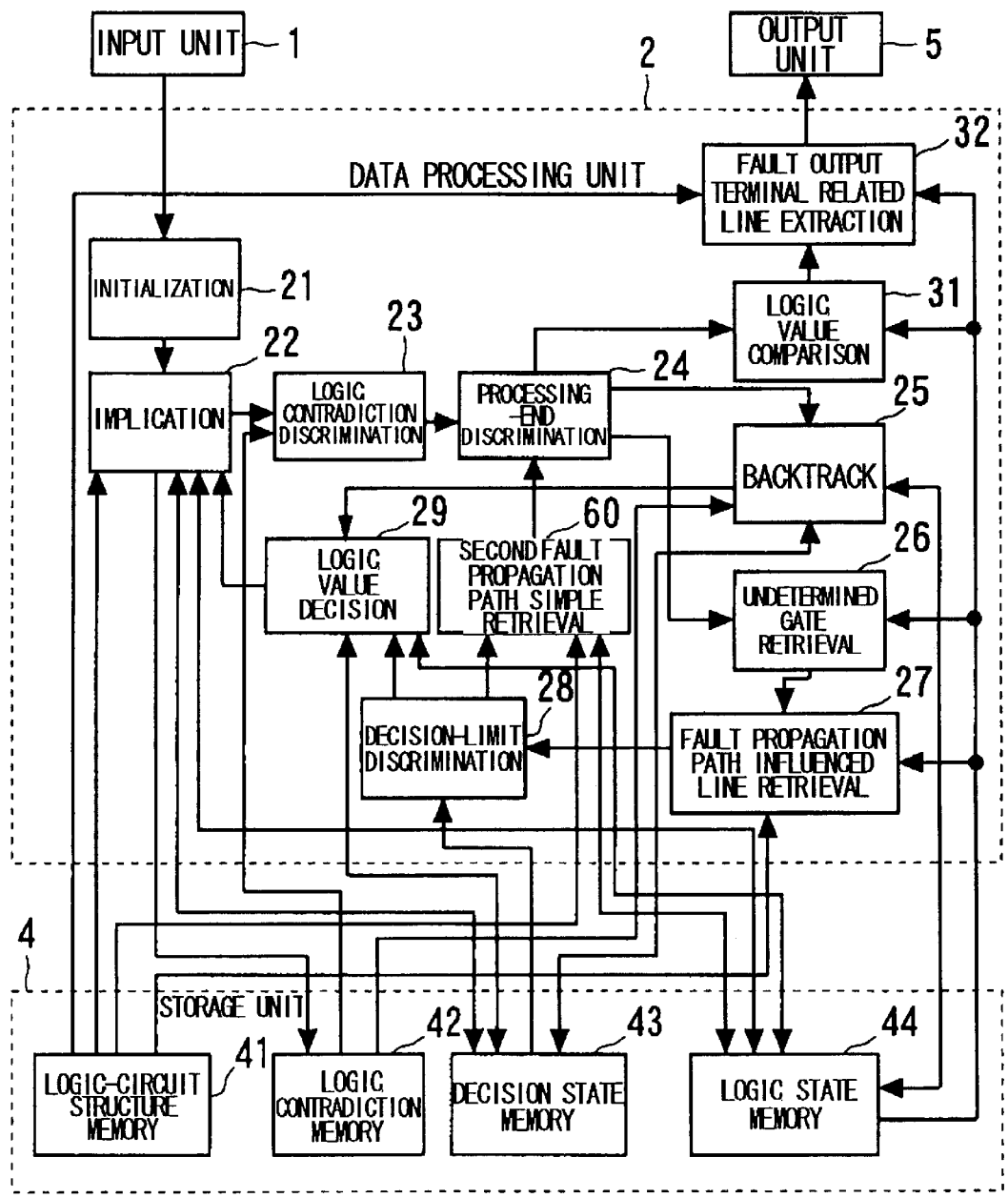
FIG. 10 is a block diagram illustrating the structure of a second embodiment of the present invention.

More specifically, a data processing unit (2 in FIG. 10) has decision-limit discrimination means (28 in FIG. 10) and second fault propagation path simple retrieval means (60 in FIG. 10). The second fault propagation path simple retrieval means (60) includes unprocessed-gate retrieval means (301 in FIG. 11), input signal line retrieval means (302 in FIG. 11), fault propagation path registration means (303 in FIG. 11) and fault propagation path discrimination means (601 in FIG. 11).

The decision-limit discrimination means compares a predetermined upper-limit value on decisions and a current number of decisions. If the upper-limit value has not been exceeded, the decision-limit discrimination means continues detailed inference of fault propagation path based upon repeated execution of decisions and implications. If the upper-limit value has been exceeded, the decision-limit discrimination means performs a discriminating operation for switching over to the fault propagation path simple retrieval means.

The unprocessed gate retrieval means retrieves a gate for which processing has not yet been executed in simple retrieval of fault propagation path, the input signal line retrieval means retrieves, from input signal lines of the retrieved unprocessed gate, a signal line for which a value has not yet been decided, and the fault propagation path registration means registers the retrieved signal line as a signal line of a fault state, thereby making possible simple path tracing in which signal lines are traced in an input direction from an undetermined gate and the signal lines are registered as fault propagation paths.

By referring to expected values of input/output signal lines of a gate, the unprocessed-gate retrieval means retrieves, from input signal lines that have been retrieved by the input signal line retrieval means, an input signal line along which there is a possibility that a fault will propagate to an output of the gate, thereby making possible more precise path tracing without prolonging processing time. The system having such means provides a fault propagation path simple retrieval system that realizes high-speed processing in a fault propagation path inferring system that includes processing for repeatedly executing logic state decisions and implications.

In accordance with the present invention, it is determined whether a predetermined decision-limit reset condition has been satisfied. If the condition is satisfied, a decision level that represents the number of times a decision regarding logic states is rendered is set again and a return is made to a logic state where the number of times a decision is rendered falls below the decision limit value that has been reset. If the number of decisions reaches the upper limit when an inference operation is in progress, a signal line along which there is the possibility that a fault will propagate to an undetermined gate is registered as a fault propagation path by simple retrieval of fault propagation paths.

Figure 19:
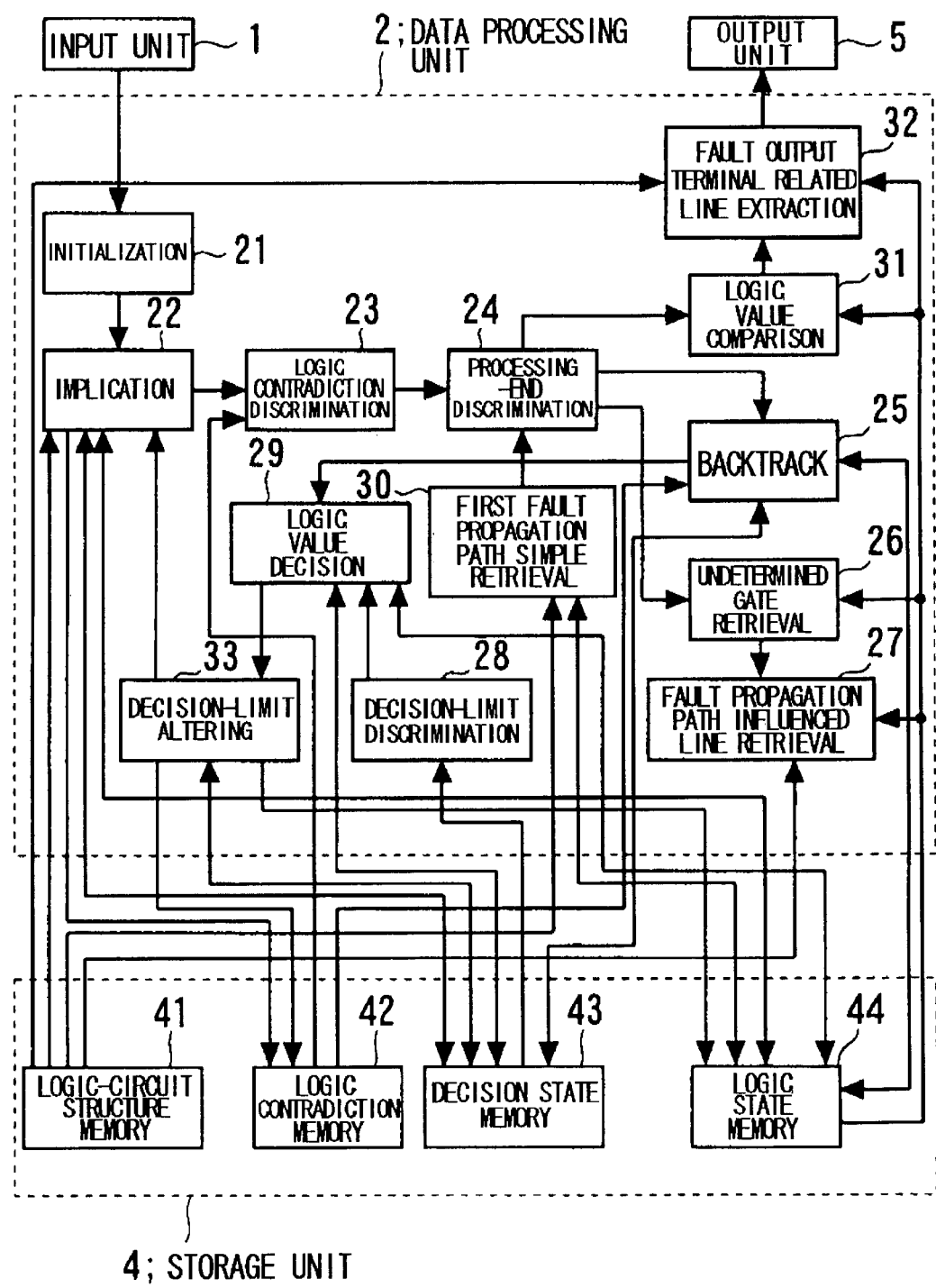
FIG. 19 is a block diagram illustrating the structure of a fourth embodiment of the present invention.

More specifically, a data processing unit (2 in FIG. 19) has decision-limit altering means (33 in FIG. 19). The decision-limit altering means (33) includes decision-limit reset condition discrimination means (331 in FIG. 20), decision-limit resetting means (332 in FIG. 20) and backtrack means (333 in FIG. 20).

The decision-limit reset condition discrimination means (331 in FIG. 20) determines whether a predetermined decision-limit reset condition has been satisfied. For example, in a case where it has been decided that the decision limit value will be reset if inference processing time has exceeded an upper-limit value, the decision-limit reset condition discrimination means (331) determines whether the inference processing time has exceeded the predetermined upper-limit value. The decision-limit resetting means (332 in FIG. 20) resets the decision limit value in accordance with a predetermined rule. The backtrack means (333) refers to a decision state storage unit to retrieve the present decision state. If the number of times decisions have been made exceeds the limit value reset by the decision-limit resetting means, the backtrack means refers to the logic states of signal lines stored in a logic state storage unit, erases the logic state of a decision level for which inference processing has already ended, a history of implications as well as logic contradictions, and restores the logic state of each signal line to a logic state that prevailed before the number of times a decision was rendered exceeded the decision limit value.

First Embodiment

A first preferred embodiment of the present invention will now be described in greater detail with reference to the drawings.

FIG. 1 is a block diagram illustrating the configuration of a system according to a first embodiment of the present invention. The system includes an input unit 1 such as a keyboard, a data processing unit 2 operated under the control of a program, a storage unit 4 such as a hard disk or memory for storing information, and an output unit 5 such as a display unit or printer.

The storage unit 4 has a logic-circuit structure memory 41, a logic contradiction memory 42, a decision state memory 43 and a logic state memory 44.

Previously stored in the logic-circuit structure memory 41 is the constitution of a logic circuit, such as type of gate, connection relationship between gates, connection relationship between gates and signal lines, and connection relationship between signal lines.

The logic contradiction memory 42 stores the gates in which logic contradictions have occurred during implication processing and the number of times logic contradictions have occurred.

The decision state memory 43 stores a decision level representing how many times decisions have been rendered and a decision level prevailing when the logic state of each signal line is inferred by implication.

The logic state memory 44 stores the logic state of each signal line undergoing processing, the implication history and the logic state (expected value) of each signal line when a circuit is normal.

Figure 16:
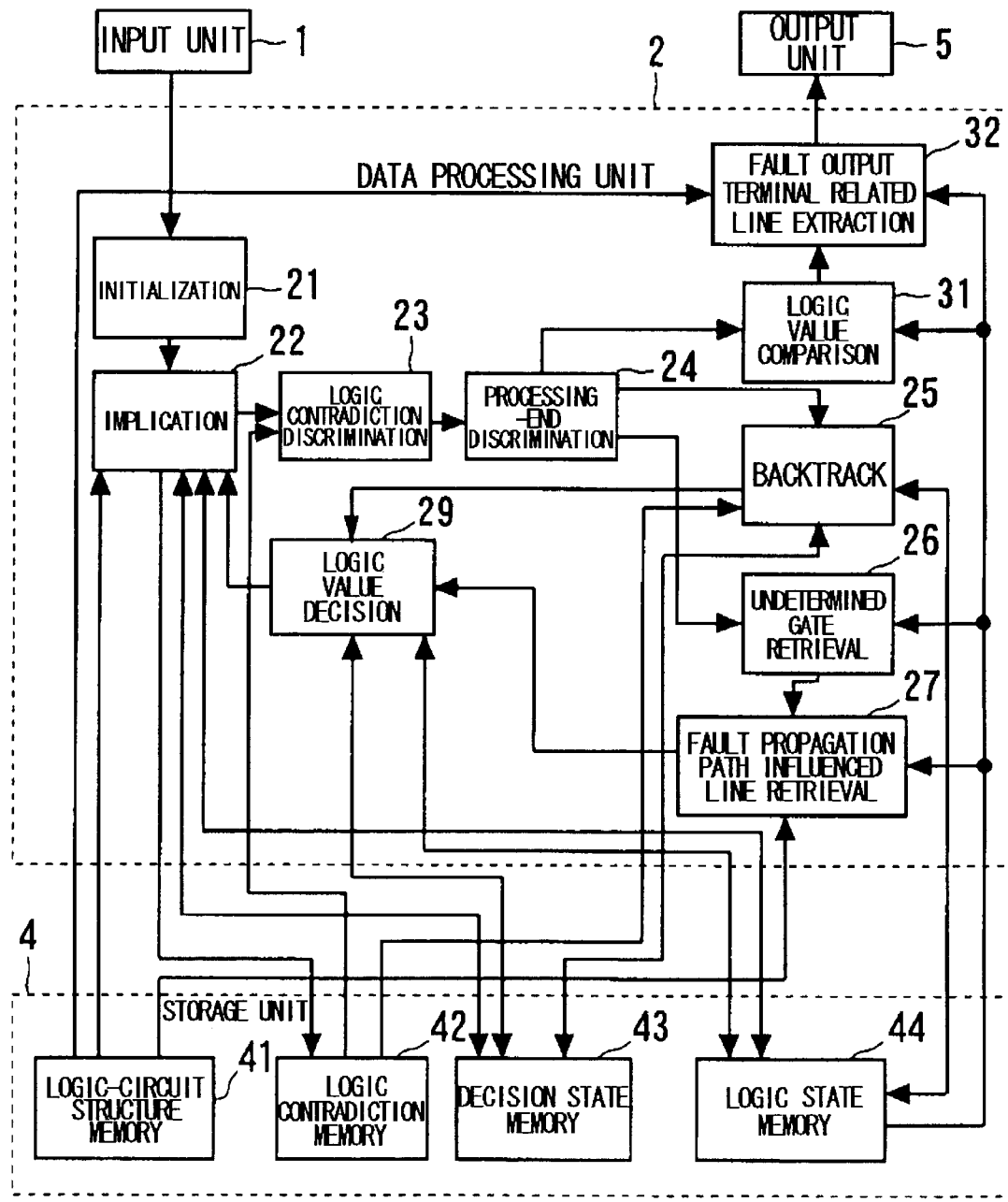
FIG. 16 is a block diagram illustrating a prior-art arrangement.
Figure 17:
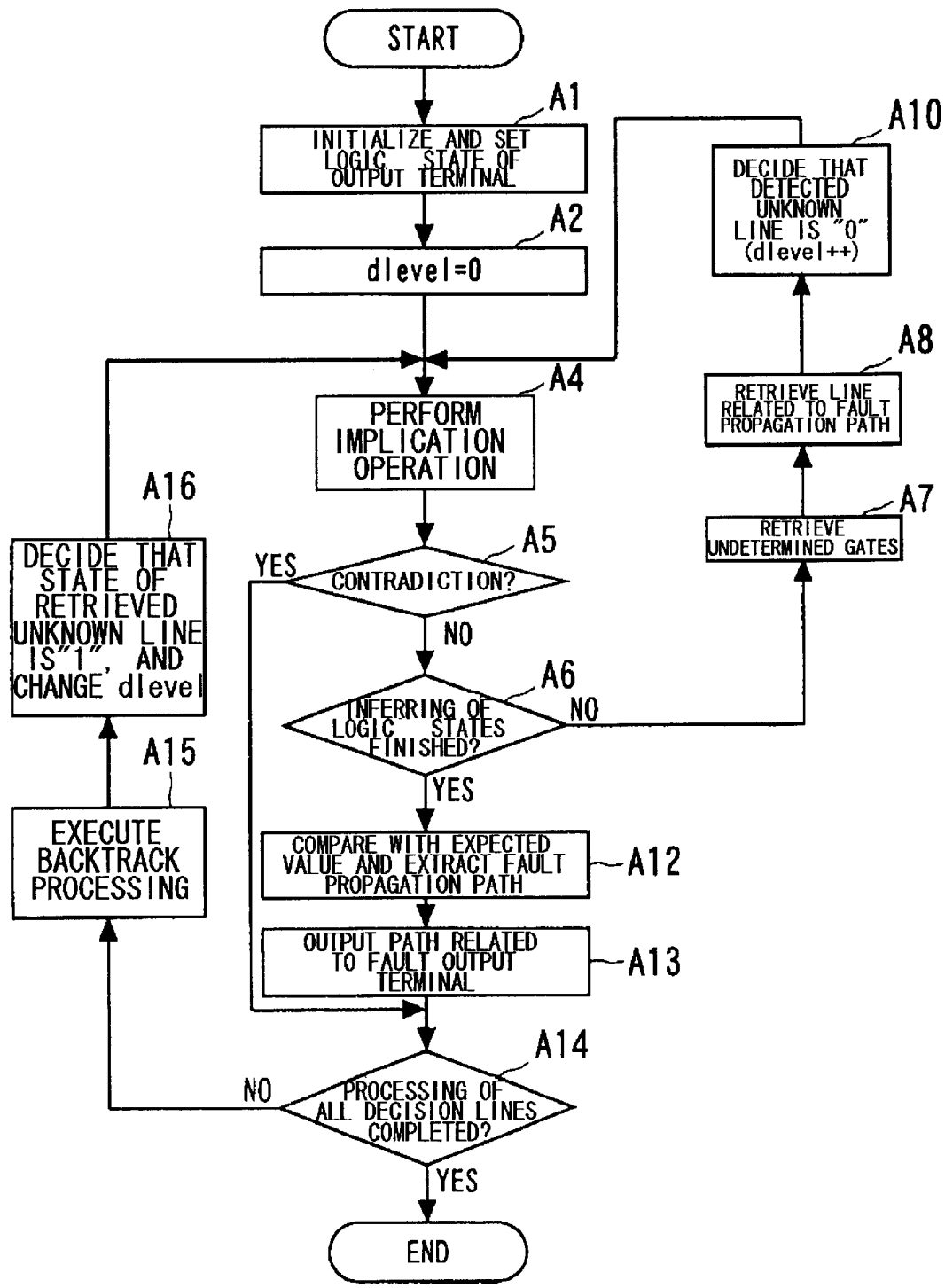
FIG. 17 is a flowchart illustrating the operation of the prior art.
Figure 18:
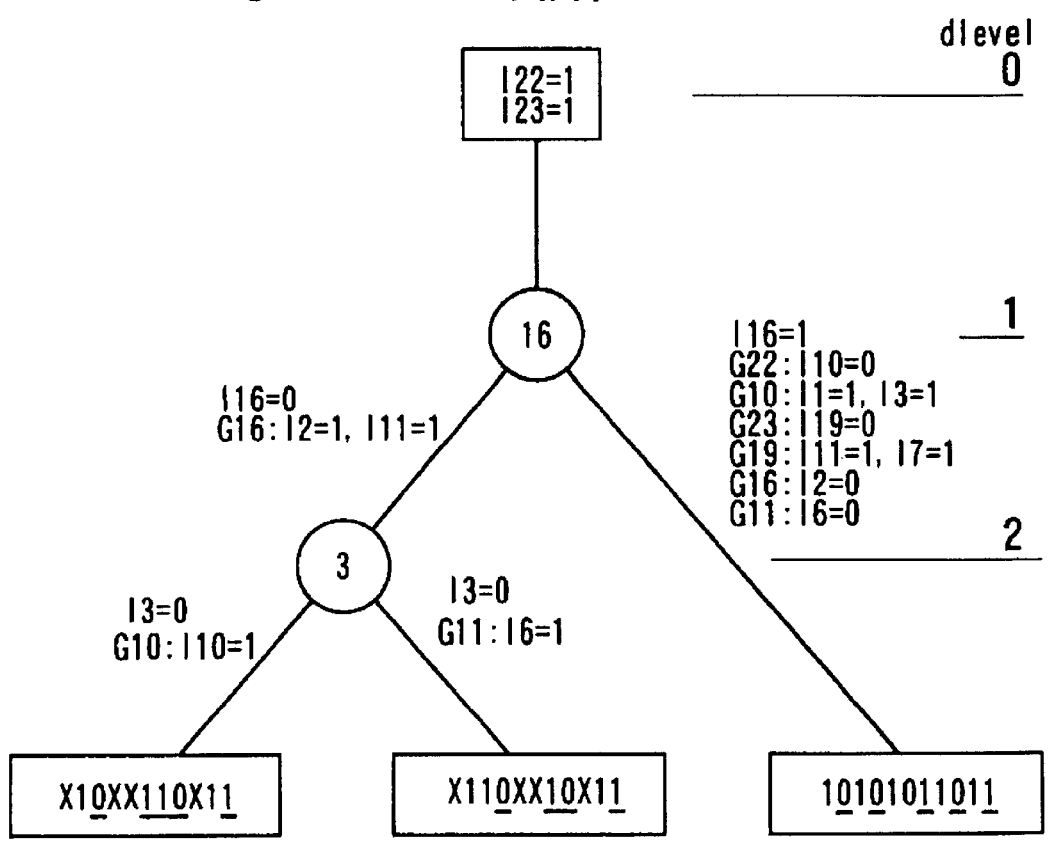
FIG. 18 is a diagram useful in describing the prior art.

The data processing unit 2 has initialization means 21, implication means 22, logic contradiction discrimination means 23, processing-end discrimination means 24, backtrack means 25, undetermined-gate retrieval means 26, retrieval means 27 for retrieving a line influenced by a fault propagation path, decision-limit discrimination means 28, logic value decision means 29, first fault propagation path simple retrieval means 30, logic value comparison means 31 and extraction means 32 for extracting a line related to a fault output terminal. The means 21 to 32 have their functions implemented by a program executed by the data processing unit 2. As shown in FIG. 1, the data processing unit 2 includes the decision-limit discrimination means 28 and the first fault propagation path simple retrieval means 30 in addition to components shown in FIG. 16.

The initialization means 21 sets the logic-circuit type and the logic state of an input/output terminal provided by the input unit 1 and initializes the logic state of a signal line. The initialization means 21 further initializes the decision level and sets an upper-limit value.

The implication means 22 refers to a logic circuit structure that has been stored in the logic-circuit structure memory 41 and to the logic state of each signal line that has been stored in the logic state memory 44, performs an implication operation at a gate connected to an input/output signal line set by the initialization means 21 and at a gate connected to a signal line decided by the logic value decision means 29, and infers the logic states of input/output signal lines of the gates.

In a case where a logic value is inferred anew, the logic value and a history of implications are stored in the logic state memory 44 and a decision level, which indicates under how many decisions the inference was made, is recorded in the decision state memory 43. If a logic contradiction occurs during an implication operation, the implication means 22 refers to the logic contradiction memory 42 and determines whether the number of logic contradictions has exceeded a predetermined allowable number. If the number of logic contradictions is greater than the allowable number, then, in order to improve the inference precision of logic states in the circuit, the implication means 22 may execute processing such as referring to the history of implications stored in the logic-circuit structure memory 41, the logic contradiction memory 42 and logic state memory 44, initializing the logic state of the signal line that is the cause of the logic contradiction and updating the information in the logic contradiction memory 42, decision state memory 43 and logic state memory 44.

The logic contradiction discrimination means 23 refers to the logic contradiction memory 42 and determines whether the number of logic contradictions on a signal line detected by the implication means 22 has exceeded a predetermined allowable number.

The processing-end discrimination means 24 refers to the logic state of each signal line stored in the logic state memory 44 and determines whether the logic states of all signal lines have been inferred.

The backtrack means 25 refers to the state of the decision stored in the decision state memory 43 and to the logic state of a signal line stored in the logic state memory 44, erases the logic state of a decision level for which processing has been completed as well as the history of implications and logic contradictions and restores the logic state of each signal line back to the logic state that prevailed prior to the rendering of the decision.

The undetermined-gate retrieval means 26 examines the logic states of the input/outputs of the gates in the combinational circuit and retrieves gates the logic state of which is incomplete. For example, if the output signal in a NAND gate is "1", one of the input signals is always "0". However, when the logic states of the input signal lines have not been decided and which signal line is "0" is unknown, then the input/output logic state of this gate is incomplete and the gate is an undetermined gate.

The retrieval means 27 that retrieves a line influenced by a fault propagation path refers to the logic circuit structure stored in the logic-circuit structure memory 41 and logic state of each signal line stored in the logic state memory 44 and retrieves an undetermined gate having an output signal for which the fault state has been inferred. This gate is retrieved from undetermined gates that have been retrieved by the undetermined-gate retrieval means 26.

The decision-limit discrimination means 28 determines whether the next decision will exceed a predetermined upper-limit value on decisions.

The logic value decision means 29 selects an input signal line of an undetermined gate for which the output signal is faulty, this gate having been detected by the retrieval means 27, and decides the logic state.

Figure 6:
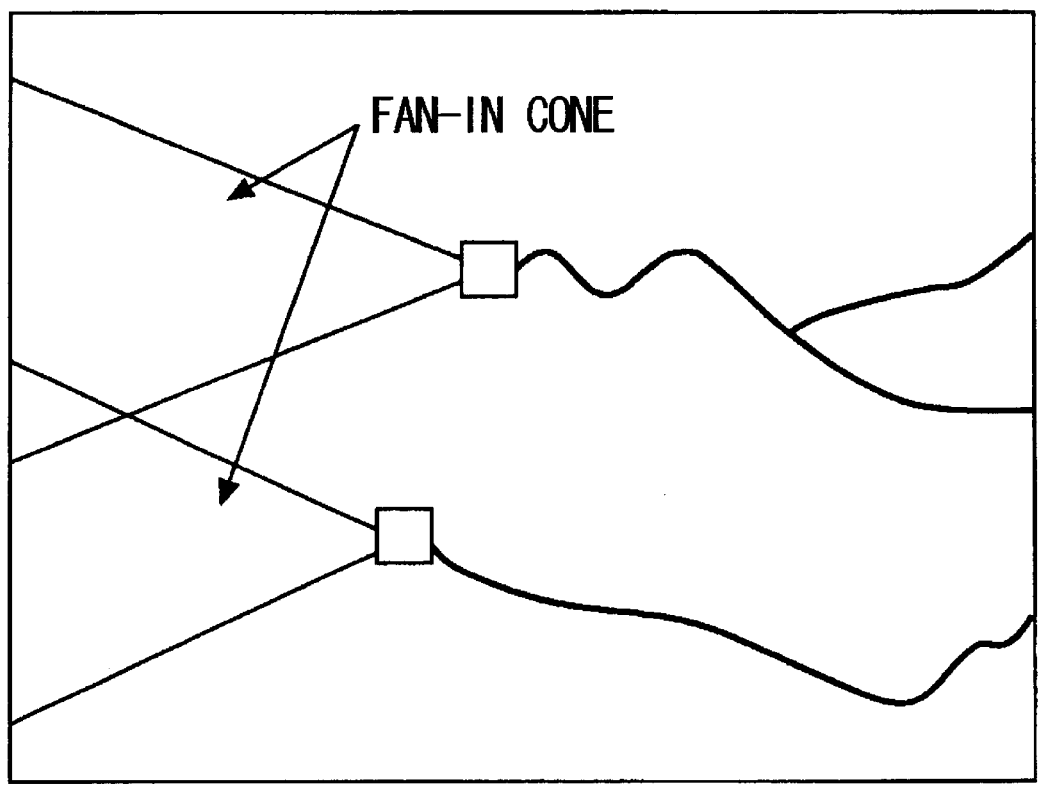
FIG. 6 is a diagram useful in describing the first embodiment.
Figure 7A:
FIGS. 7a and 7b are diagrams useful in describing the first embodiment.
Figure 7A:
Figure 7A:
Figure 7B:
Figure 7B:
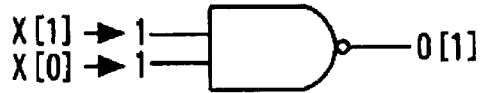
Figure 7B:
Figure 7B:

The first fault propagation path simple retrieval means 30 traces a circuit in the input direction from an undetermined gate, extracts a fan-in cone of the kind shown schematically in FIG. 6, and registers all signal lines, for which the logic state has not been decided among paths included in the fan-in cone, as fault propagation paths in the logic state memory 44.

Figure 2:
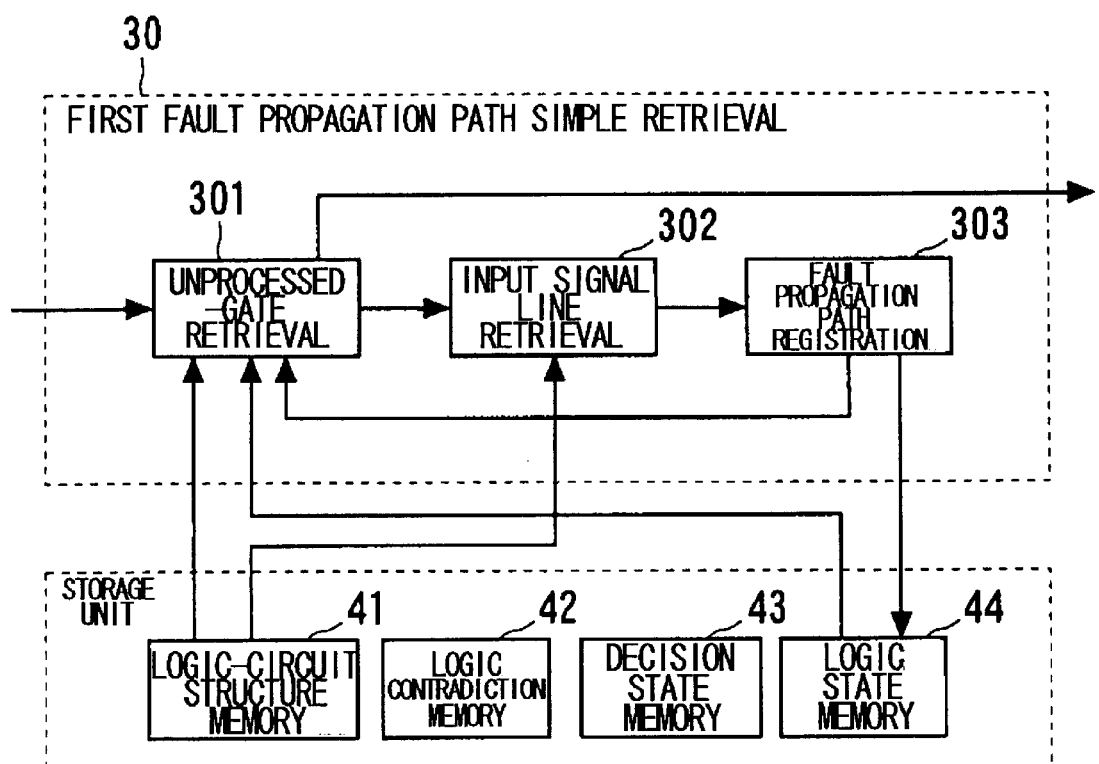
FIG. 2 is a block diagram illustrating the structure of first fault propagation path simple retrieval means according to the first embodiment.

FIG. 2 is a block diagram illustrating the structure of the first fault propagation path simple retrieval means 30.

As shown in FIG. 2, the first fault propagation path simple retrieval means 30 includes unprocessed-gate retrieval means 301, input signal line retrieval means 302 and fault propagation path registration means 303.

The unprocessed-gate retrieval means 301 refers to the logic-circuit structure memory 41 and logic state memory 44 and retrieves (a) an undetermined gate, the output signal of which is faulty, detected by the retrieval means 27 for retrieving a line influenced by a fault propagation path, and (b) a gate, which has not yet undergone first simple retrieval of fault propagation path among gates on a signal-line input side, registered by the fault propagation path registration means 303.

The input signal line retrieval means 302 retrieves a signal line for which the logic state has not been determined from among one or plural input signal lines of the unprocessed gate retrieved by the unprocessed-gate retrieval means 301.

The fault propagation path registration means 303 adopts the logic state of the signal line retrieved by the input signal line retrieval means 302 as a fault state and records this in the logic state memory 44.

The description of the first embodiment will continue with reference again to FIG. 1.

The logic value comparison means 31 compares the obtained logic state of each signal line with an expected value representing the logic state of each signal line found by logic simulation in a normal circuit, and extracts the fault propagation path.

The extraction means 32 extracts, from the fault propagation paths that have been extracted by the logic value comparison means 31, a fault propagation path that will have a direct influence upon a fault output terminal when a fault exists on the path, and outputs data to the output unit 5.

The data processing unit 2 shown in FIG. 1 is such that the blocks are readily implemented by logic circuits. By placing the logic circuits on a single chip, high-speed processing can be executed. Processing at even higher speed can be achieved by implementing the storage unit 4 using a memory device and incorporating the device in the form of a system LSI circuit.

Figure 3:
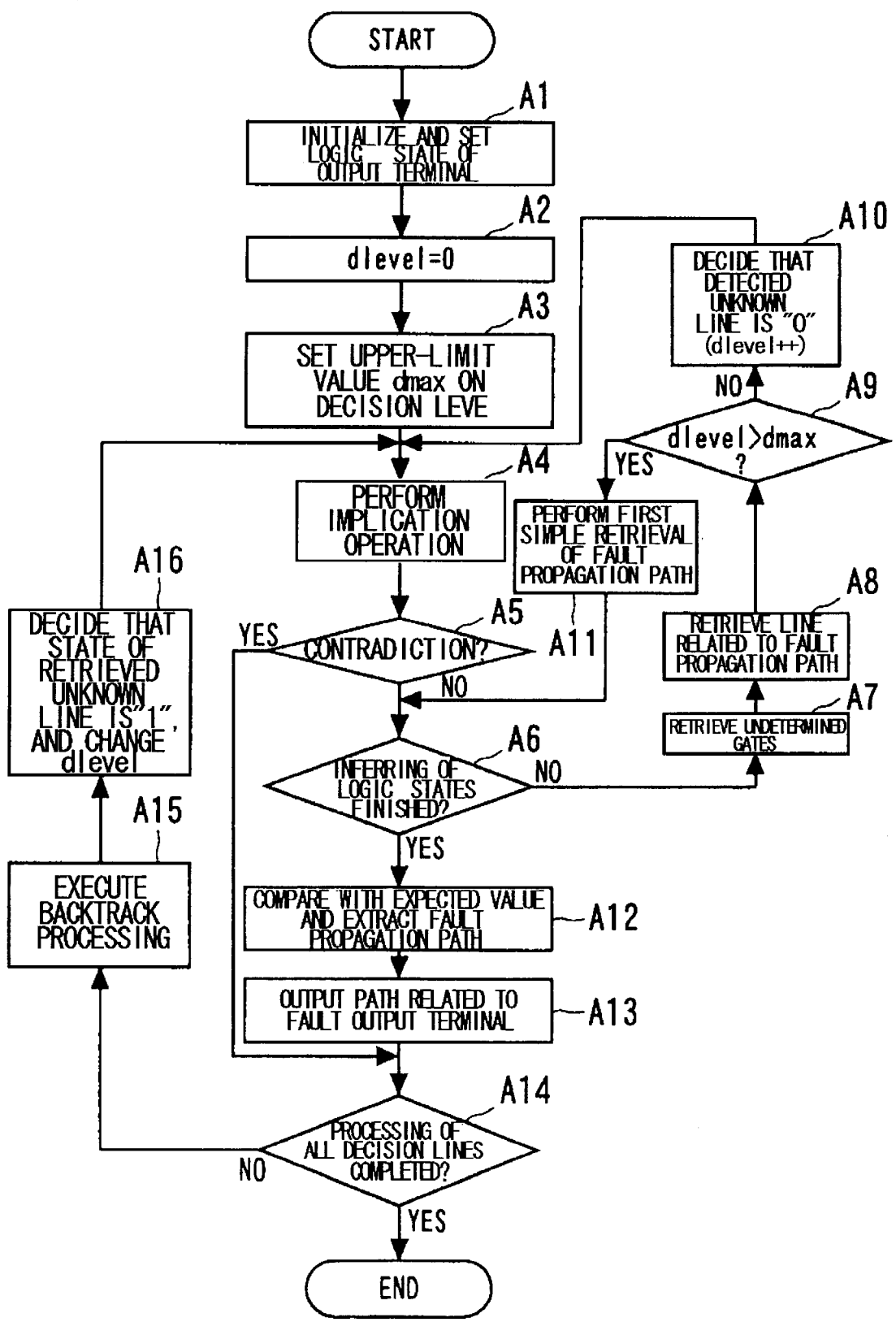
FIG. 3 is a flowchart illustrating the operation of the system according to the first embodiment.
Figure 4:
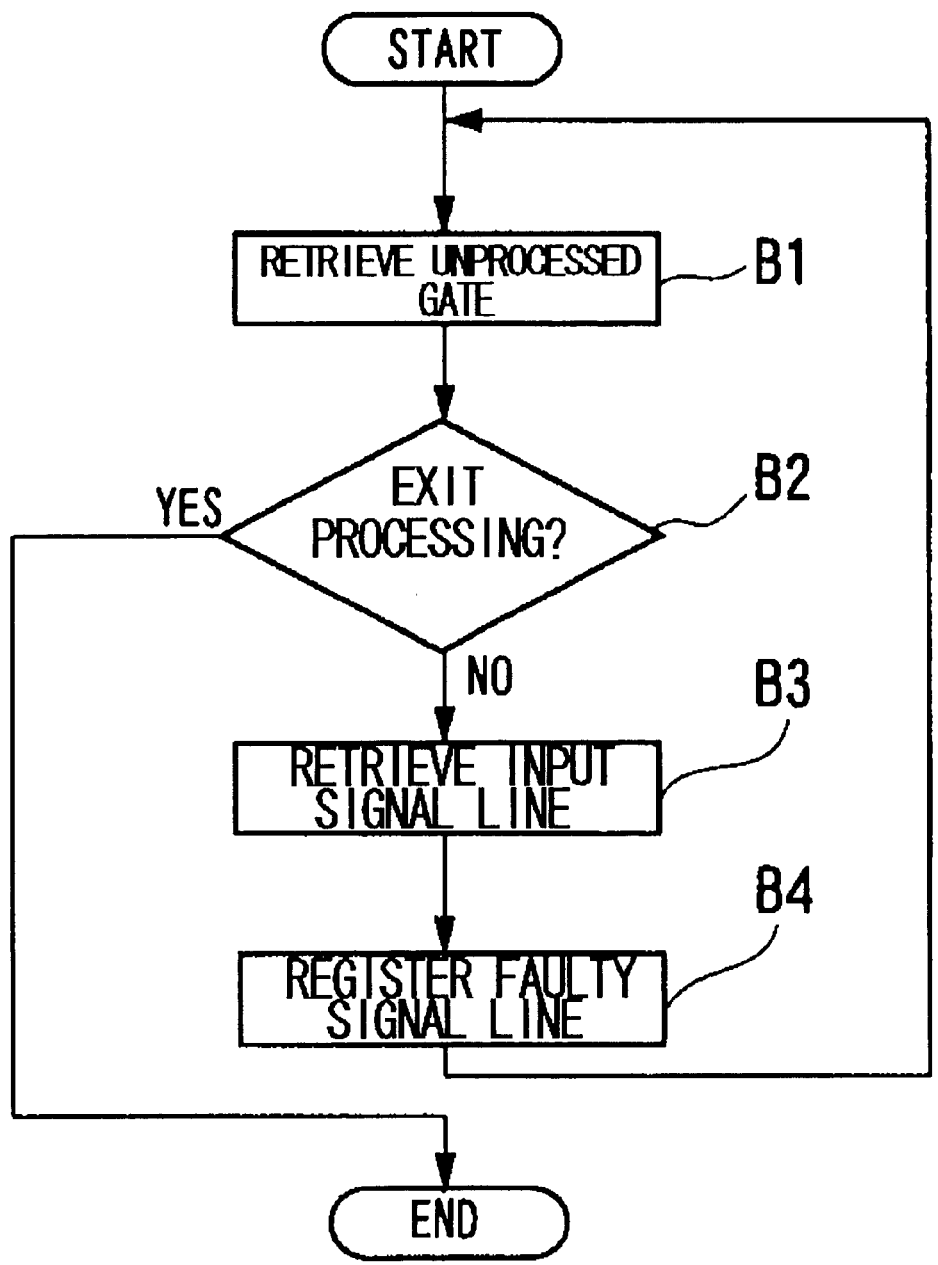
FIG. 4 is a flowchart illustrating the operation of the first fault propagation path simple retrieval means according to the first embodiment.

FIGS. 3 and 4 are flowcharts useful in describing the flow of processing according to the first embodiment of the present invention. The operation of the first embodiment will be described with reference to FIGS. 1 to 4 and FIG. 7. For the sake of explanation, the logic states of a signal line will be represented by four values, namely "0", "1", "U" (Unknown) and "X" (Don't Care). However, the present invention is not limited to this four-value representation and is of course applicable also to a case where logic states based upon a different representation are used.

It should be noted that the logic state "U" (Unknown) indicates an unknown state in which the logic state of a signal line cannot be determined to be "0" or "1".

The logic state "X" (Don't Care) means that both the "0" and "1" logic states are allowed when the logic state of a signal line does not produce a contradiction in the overall logic circuit regardless of whether the logic state of the line is "0" or "1".

The logic state of an input/output terminal provided by the input unit 1 is set in the initialization means 21 to initialize a decision level (dlevel) that represents the number of times a decision is rendered (steps A1 and A2 in FIG. 3).

Next, an upper-limit value (dmax) of the decision level is set (step A3).

Next, the implication means 22 performs an implication operation (step A4). This is an operation for inferring, from the already inferred logic state of an input/output line of a gate at each gate, the logic state of an input/output line of a gate for which an inference has not yet been made. The implication means 22 retrieves a gate for which an implication operation is possible. Namely, using the function of the gate and the logic state of an input/output line connected to this gate and for which the logic state has been determined, the implication means 22 retrieves a gate for which it is possible to imply the logic state of an input/output line that is connected to the above-mentioned gate and whose logic state has not yet been decided. The logic state of the input/output signal line at the detected gate is then inferred. The inferred logic state is recorded in the logic-circuit structure memory 41 and is recorded also in the decision state memory 43 together with the decision level at this time and the history of the implication operation. FIG. 7 illustrates a specific example of an implication operation in a NAND gate.

The logic contradiction discrimination means 23 refers to the logic contradiction memory 42 to determine whether the number of logic contradictions has exceeded an allowable number (step A5).

If the logic contradiction discrimination means 23 finds that the number of contradictions is not greater than the allowable number ("NO" at step A5), then the processing-end discrimination means 24 refers to the signal-line logic states that have been stored in the logic state memory 44 and determines whether the logic states of all signal lines have been inferred to be "0", "1" or "X" (step A6). If the number of contradictions is greater than the allowable number ("YES" at step A5), this means that a fault propagation path will not be found by the present decision and, hence, control proceeds to the processing of step A14.

If it is determined that the inferring of the logic states of all signals lines is not finished ("NO" at step A6), then the undetermined-gate retrieval means 26 examines the input/output logic states of the gates in the combinational circuit and retrieves undetermined gates for which the logic state is incomplete (step A7).

Next, the retrieval means 27 for retrieving a line influenced by a fault propagation path retrieves an undetermined gate having an output signal for which the fault state has been inferred (step A8), from undetermined gates retrieved at step A6, by referring to the logic circuit structure stored in the logic-circuit structure memory 41 and logic state of each signal line stored in the logic state memory 44.

The decision-limit discrimination means 28 determines whether the decision level has exceeded the allowable value of the decision level set at step A3 (step A9).

If the decision level has not exceeded the allowable value of the decision level, then the logic value decision means 29 renders a "0" decision with respect to a detected signal line and increments (to dlevel++) the decision level (dlevel) that represents the number of times a decision has been rendered (step A10). Control then returns to implication processing (step A4) by the implication means 22.

If it is found at step A9 that the decision level has exceeded the allowable value, then the first fault propagation path simple retrieval means 30 performs simple retrieval of a fault propagation path (step A11).

The first fault propagation path simple retrieval means 30 will now be described in detail with reference to FIG. 2, which shows the structure of the retrieval means 22, and FIG. 4, which illustrates the flow of processing thereby.

First, at step B1 in FIG. 4, the unprocessed-gate retrieval means 301 refers to the logic-circuit structure memory 41 and logic state memory 44 and retrieves an undetermined gate, the output signal of which is faulty, detected at step A8 in FIG. 3, and a gate, which has not undergone first simple retrieval of fault propagation path among gates on a signal-line input side, registered by the fault propagation path registration means 303.

If an unprocessed gate is not detected, processing for first simple retrieval of a fault propagation path is exited ("YES" at step B2). If an unprocessed gate is detected ("NO" at step B2), control proceeds to step B3.

The input signal line retrieval means 302 retrieves a signal line for which the logic state has not been determined from among one or plural input signal lines of the unprocessed gate retrieved by the unprocessed-gate retrieval means 301 (step B3).

The fault propagation path registration means 303 adopts the logic state of the signal line retrieved by the input signal line retrieval means 302 as a fault state and records this in the logic state memory 44 (step B4).

Reference will be had to FIG. 3 again to continue the description of system operation.

If the processing-end discrimination means 24 determines at step A6 that the logic states of all signal lines have been inferred ("YES" at step A6), this means that a logic state in the circuit has been determined to be "0", "1" or "X". Accordingly, the logic value comparison means 31 extracts a signal line whose state is different from that of the expected value, i.e., extracts a fault propagation path (step A12). Furthermore, the extraction means 32 extracts from the fault propagation paths a fault propagation path that will have a direct influence upon a fault output terminal when a fault exists on the path. The extraction means 32 outputs this data to the output unit 5 (step A13).

Next, it is determined whether decision processing for both "0" and "1" has been completed with regard to all lines for which decisions have been rendered (step A14).

If it is found at step A14 in FIG. 3 that the logic states of all signal lines have been inferred, then the logic states of signal lines in the combinational logic circuit will have been inferred to be "0", "1" or "X". The processing of step A14 is executed also in a case where a contradiction has been detected by the logic contradiction discrimination means 23.

If the processing-end discrimination means 24 determines that decision processing has not ended ("NO" at step A14), the backtrack means 25 retrieves one decided line, the state of which has not been decided to be "1", from lines having a high decision level, initializes the logic state of a signal line inferred in a decision whose level is higher than that of the decision of the detected decided line and restores the logic state of each signal line to the logic state that prevailed prior to the rendering of this decision (step A15). The logic value decision means 29 decides that the state of the decided line detected by the backtrack means 25 is "1" (step A16), after which control returns to the implication operation (step A4) by the implication means 22.

If the processing-end discrimination means 24 determines that decision processing has ended ("YES" at step A14), then processing for extracting a fault propagation path is exited.

A specific example will now be described with reference to FIGS. 1 to 6 to provide a more detailed explanation of the first embodiment of the present invention. The configuration of the system in this embodiment is as shown in FIG. 1, the structure of the first fault propagation path simple retrieval means 30 is as shown in FIG. 2, and the operation of the system and the operation of the first fault propagation path simple retrieval means 30 are as indicated by the flowcharts of FIGS. 3 and 4, respectively.

In this embodiment as shown in FIG. 1, the initialization means 21 performs an initializing operation and then the logic states of signal lines in a circuit are inferred by the implication means 22, logic contradiction discrimination means 23, backtrack means 25, undetermined-gate retrieval means 26, retrieval means 27 for retrieving a line influenced by a fault propagation path, and logic value decision means 29. As a result of logic decisions and implications performed a certain number of times, fault propagation paths of the kind shown by way of example in FIG. 5 are inferred.

Figure 5:
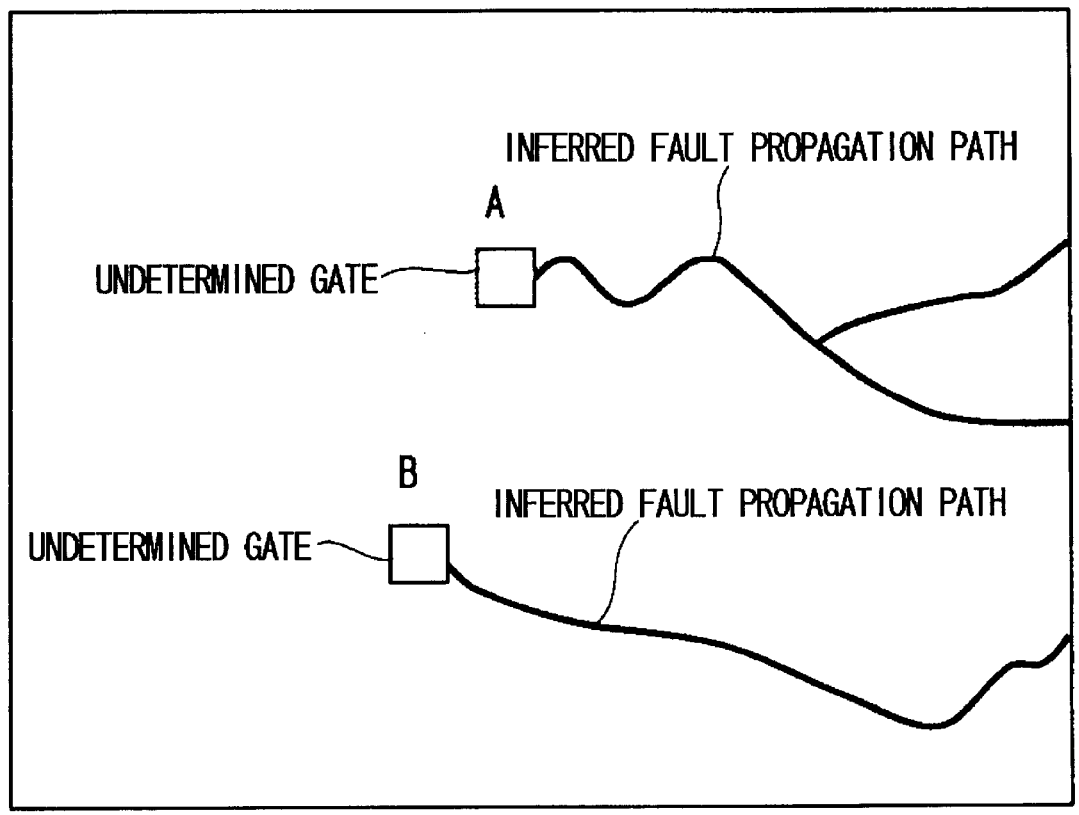
FIG. 5 is a diagram useful in describing the first embodiment.

Next, if the number of decisions has not exceeded the upper limit, an assumption of a logic state is made with regard to the input signal line of an undetermined gate A or B in FIG. 5 and a path on which a fault is being propagated continues to be inferred.

If the number of decisions has exceeded the upper limit, the first fault propagation path simple retrieval means 30 traces fan-in cones of the undetermined gates A and B, as shown in FIG. 6, and registers all signal lines in the cones as fault propagation paths. A fan-in cone represents a collection of signal lines and gates obtained when an input signal line of a certain gate is traced recursively in the input direction.

By virtue of this processing, it is possible to infer faulty locations in a short time by executing high-speed simple retrieval of fault propagation paths during the course of inference processing in which logical decisions and implications require an extended period of time. In addition, processing time and inference precision can be adjusted by selecting the upper limit on the number of times decisions are rendered.

Figure 8:
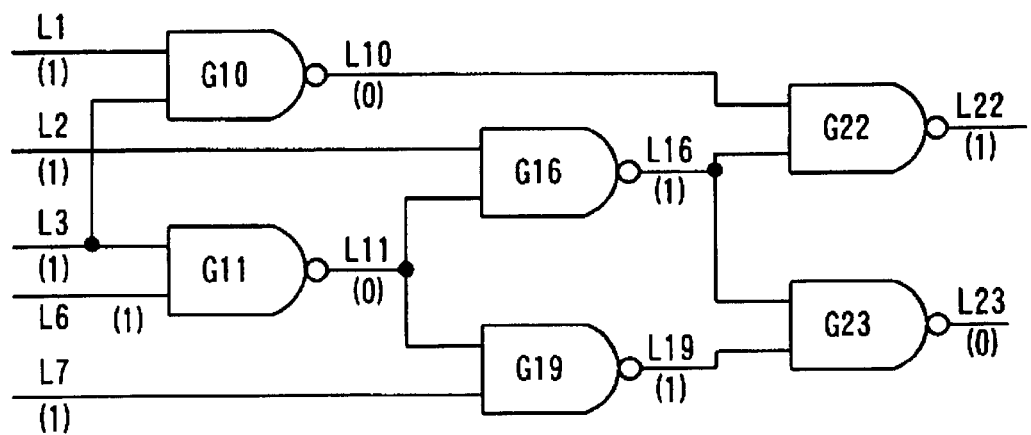
FIG. 8 is a diagram useful in describing the first embodiment.

A specific operation according to the first embodiment of the invention will be described in detail with reference to FIGS. 1 to 4 and FIGS. 8 and 9 case in which the present invention is applied to a combinational logic circuit shown in FIG. 8 will be described.

Consider a case where the expected values of input/output terminals of a gate G23 of interest and the logic values (L22=1, L23=1) of the output signal have been given as the initial state. Accordingly, L23 is the fault output.

First, the initialization means 21 sets the logic states and expected values of the input/output terminals and signal lines. The initialization means 21 sets the following: L1=X[1], L2=X[1], L3=X[1], L6=X[1], L7=X[1], L22=1[1], L23=1[0] step A1). The numerals enclosed by the brackets represent the expected values. The initialization means 21 initializes the decision level (dlevel) (step A2) and then sets the allowable value (dmax) of the decision level (step A3). Here the allowable value of the decision level is set to 1.

Next, at step A4 in FIG. 3, the implication means 22 finds the logic value of a signal line in the logic circuit. Here a signal line is not implicated by L22=1, and L23=1. Since a logic contradiction does not occur, the logic contradiction discrimination means 23 judges that there is no logic contradiction (step A5).

Since a fault propagation path that will cause a fault output at L23 is not found, the processing-end discrimination means 24 determines that processing is not finished (step A6) and control therefore proceeds to step A7.

NAND gates G22, and G23, for which the output signals are "1" and for which the input signals have not yet been inferred as being "0", are retrieved as undetermined gates by the undetermined-gate retrieval means 26 at step A7.

At step A8 the retrieval means 27 for retrieving a line influenced by a fault propagation path selects L16 as a signal line for which a logic value has not been determined. The selection is made from the input signal lines of undetermined gate G23 having the fault signal as its output signal.

Since the decision level (dlevel=0) has not reached the limit value (dmax=1), control proceeds from step A9 to step A10.

The logic value of signal line L16 detected at step A8 is decided to be "0" and the decision level is incremented (step A10).

By virtue of the implication operation performed at step A4, L2=1, and L11=1 are implicated at G16 from L16=0.

A logic contradiction is not detected at step A5 and the inferring of logic states is not finished. Control proceeds to step A7 as a result.

A gate G11 is detected as an undetermined gate at step A7. Since a fault signal has been inferred as the output signal of the gate G11, the input signal line L3 thereof is selected at step A8.

Now the decision level is 1 and, hence, the limit value (dmax=1) has been reached. At step A9, therefore, it is judged that the limit value has been reached ("YES" at step A9). Control proceeds to step A11.

The unprocessed-gate retrieval means 301 retrieves G11 at step B1 in FIG. 4.

Since an unprocessed gate is retrieved, control proceeds to step B3.

The input signal line retrieval means 302 retrieves L3, and L6, for which logic values have not been decided, as the input signal lines of gate G11 (B3).

Next, at step B4, L3 and L6 are registered in the logic state memory 44 as fault signal lines.

Since all unprocessed gates have been processed, first simple retrieval of fault propagation paths is ended and control proceeds to the next process.

Since all logic states have been determined, it is judged at step A6 that the inferring of logic states is finished and control proceeds to step A12.

The logic value comparison means 31 extracts a signal line whose state is different from that of the expected value, i.e., extracts a fault propagation path (step A12). As a result, L3, L6, L11, L16, and L23 are extracted as the fault propagation paths.

Furthermore, among the fault propagation paths, L3, L11, L16, and L23 are fault propagation paths that have a direct influence upon the fault output terminal when a fault exists on the path. Therefore the extraction means 32 for extracting a line related to a fault outputs these paths to the output unit 5 (step A13).

Since L16 has not been decided to be "1" as a decided line, it is determined at step A14 that processing is not finished and, hence, control proceeds to step A15.

The state that prevailed immediately prior to the decision on L16 is restored by the backtrack means 25. Accordingly, the decision level becomes 0 and the signal lines for which logic values have been decided become L22=1 and L23=1 (step A15). Now a decision to the effect that L16=1 holds is rendered and the decision level becomes dlevel=1 (step A16).

Next, the logic value of the signal line in the logic circuit is found by implication means 22 at step A4. By virtue of the implication operation at G16, L16=1 is implicated. Thereafter, L10=0 is implicated at G22, L1=1 and L3=1 at G10, L19=0 at G23, L7=1 and L11=1 at G19, and L6=0 at G11. Thus the logic values of all signal lines are found.

A contradiction is not detected at step A5 and the inferring of logic states ends. Control then proceeds to step A12.

A comparison with expected values is made by the logic value comparison means 31 at step A12, whereby L2, L6, L11, L19 and L23 are extracted as the fault propagation paths.

Since all of these paths are capable of propagating a fault state to the fault output terminal L23, these paths are output to the output unit 5 (step A13).

Figure 9:
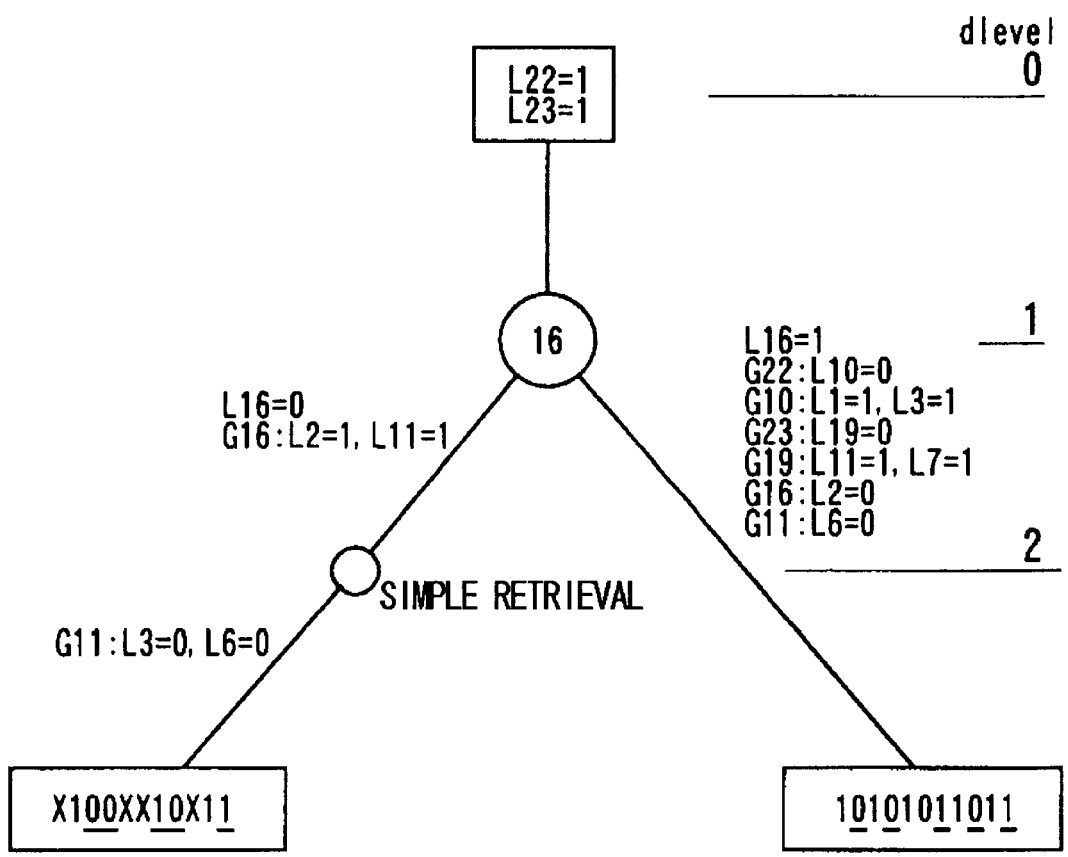
FIG. 9 is a diagram useful in describing the first embodiment.

FIG. 9 illustrates the above processing in the form of a tree structure. The number of times a logical decision is rendered is one only. When two or more decisions are required, simple path retrieval is used. This makes it possible to find fault propagation paths at high speed.

Embodiment

A second preferred embodiment of the present invention will now be described in detail with reference to the drawings.

FIG. 10 is a block diagram illustrating the configuration of a system according to a second embodiment of the present invention. As shown in FIG. 10, the second embodiment differs from the first embodiment in that the first fault propagation path simple retrieval means 30 in the data processing unit 2 of the first embodiment shown in FIG. 1 is replaced by a second fault propagation path simple retrieval means 60.

Figure 11:
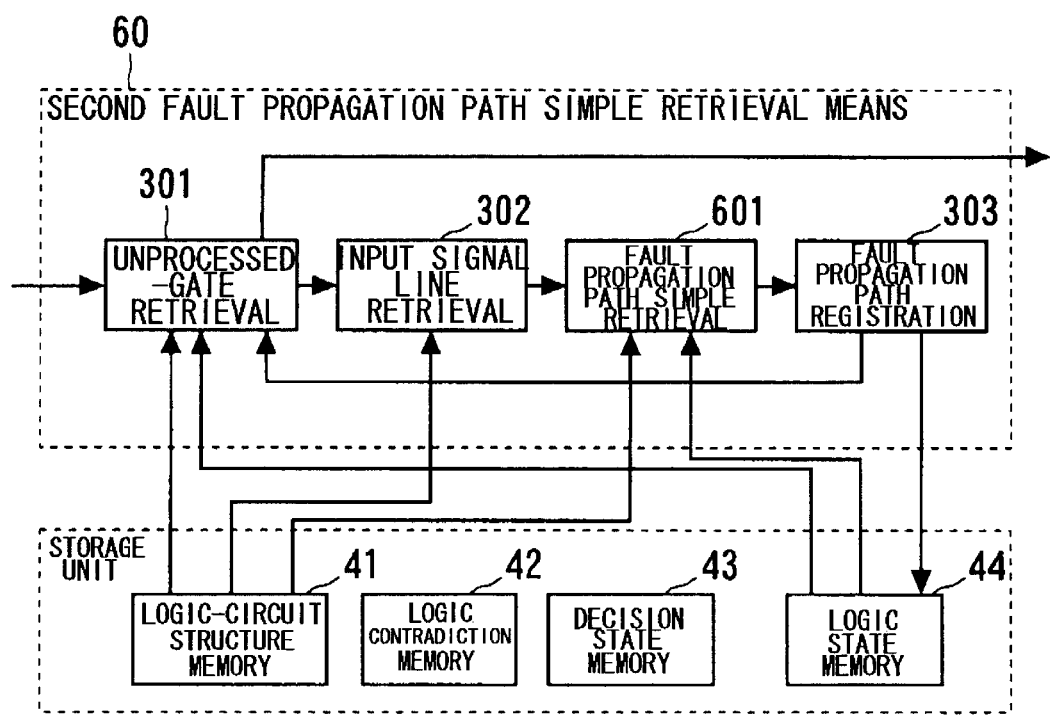
FIG. 11 is a block diagram illustrating the structure of second fault propagation path simple retrieval means according to the second embodiment.

FIG. 11 is a block diagram illustrating the structure of the second fault propagation path simple retrieval means 60 according to the second embodiment. As shown in FIG. 11, the second fault propagation path simple retrieval means 60 is obtained by adding fault propagation path discrimination means 601 to the arrangement of the first fault propagation path simple retrieval means 30 shown in FIG. 2.

Figure 14:
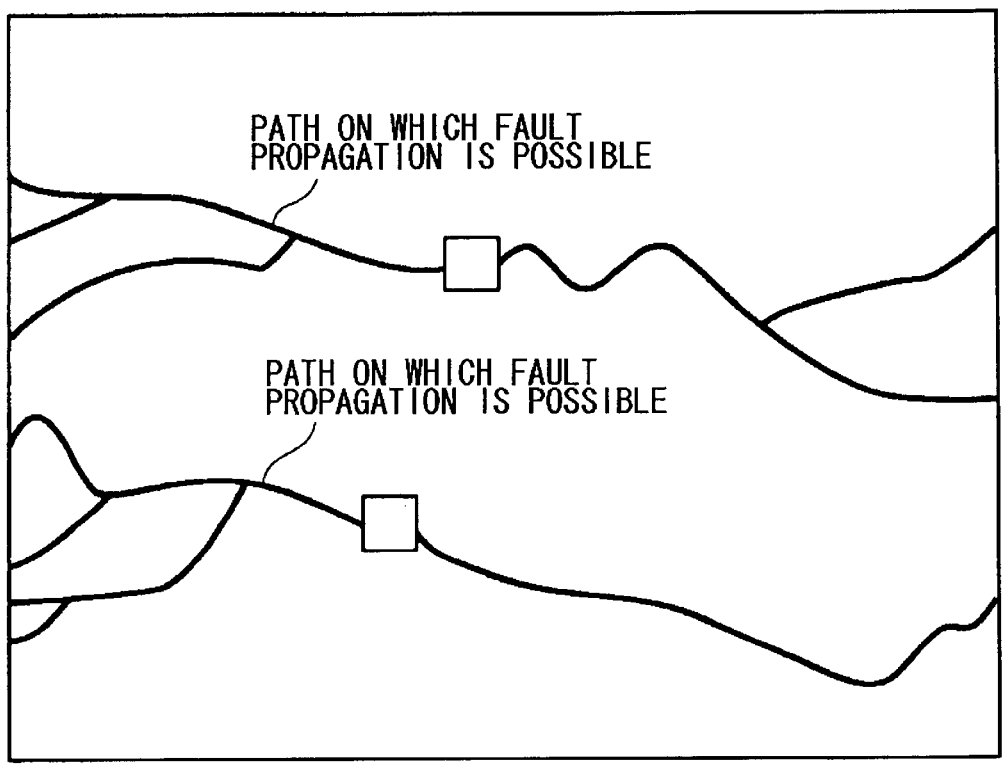
FIG. 14 is a diagram useful in describing the second embodiment.

The second fault propagation path simple retrieval means 60 traces a circuit in the input direction from an undetermined gate, extracts fault propagation paths of the kind shown in FIG. 14 and registers all of these in the logic state memory 44 as fault propagation paths.

As shown in FIG. 11, the second fault propagation path simple retrieval means 60 includes the unprocessed-gate retrieval means 301, the input signal line retrieval means 302, the fault propagation path registration means 303 and the fault propagation path discrimination means 601.

The fault propagation path discrimination means 601 refers to the functions of gates that have been stored in the logic-circuit structure memory 41 and to the expected values of gate input/output terminals that have been stored in the logic state memory 44, and retrieves, from input signal lines retrieved by the input signal line retrieval means 302, an input signal line for which there is a possibility that the output logic value of a gate will be rendered faulty.

For example, consider a situation where input signal lines I1 and I2, and an output signal line 01 are connected to a certain two-input gate and the logic states of the two input signals are undetermined. If an input signal line for which there is a possibility that the output signal will be rendered faulty is only the line I1, with there being no possibility that the output signal will be rendered faulty regardless of the logic value taken on by the line I2, then the first fault propagation path simple retrieval means 30 will retrieve both I1 and I2, whereas the second fault propagation path simple retrieval means 60 will retrieve only I1.

Figure 12:
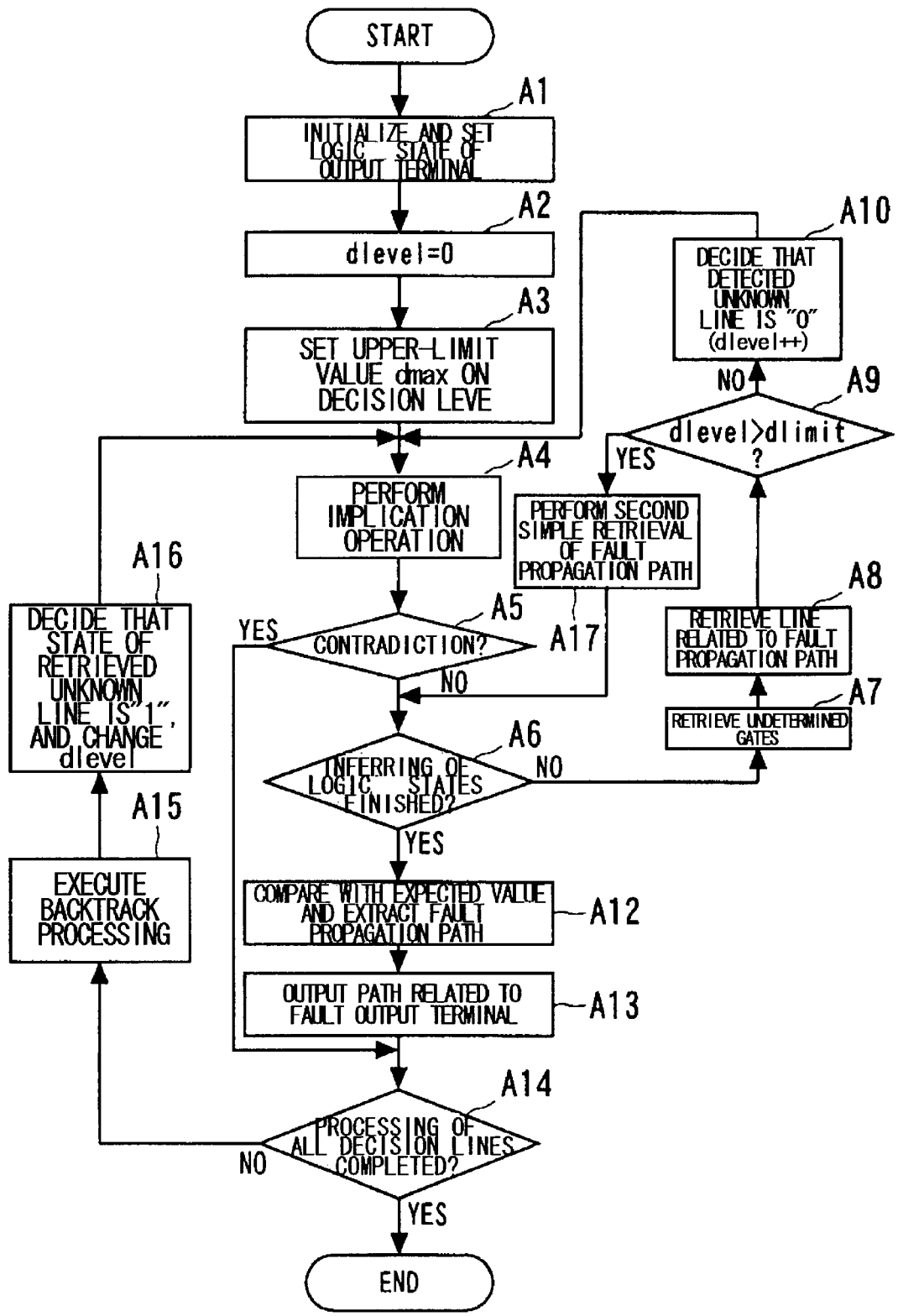
FIG. 12 is a flowchart illustrating the operation of the second embodiment.
Figure 13:
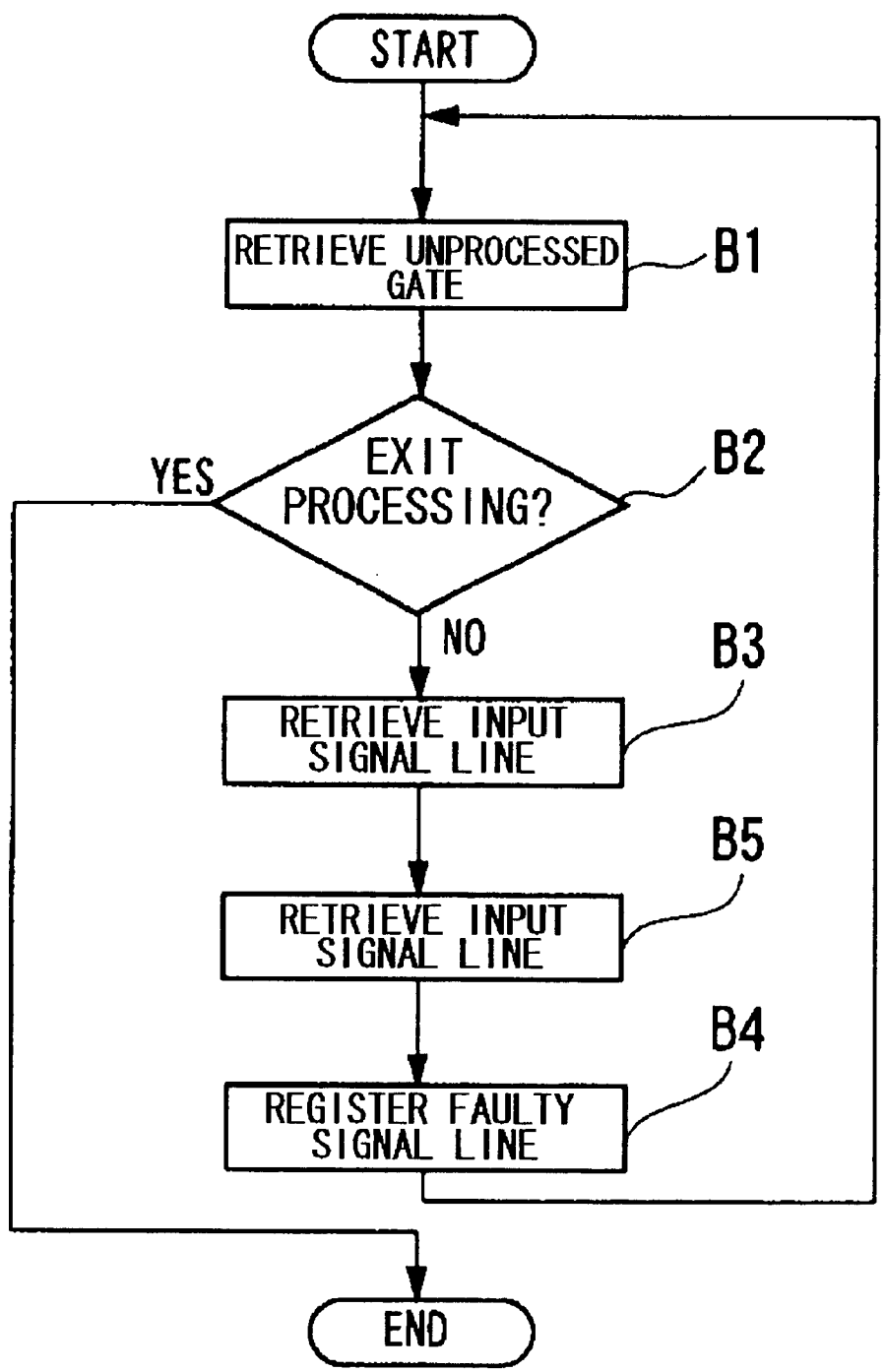
FIG. 13 is a flowchart illustrating the operation of the second fault propagation path simple retrieval means according to the second embodiment.

FIG. 12 is a flowchart for describing system operation according to the second embodiment of the present invention, and FIG. 13 is a flowchart for describing the operation of the second fault propagation path simple retrieval means 60 according to the second embodiment. The operation of the second embodiment will be described in detail with reference to FIGS. 10 to 13.

Means 21 to 29, 31 and 32 in the second embodiment and the operations thereof indicated at steps A1 to A10 and A12 to A16 in FIG. 12, i.e., means other than the second fault propagation path simple retrieval means 60 and operation thereof in the data processing unit 2, are the same as the means 21 to 29, 31 and 32 in the first embodiment and the operations thereof (steps A1 to A10 and A12 to A16 in FIG. 3). A description thereof, therefore, is omitted.

Processing (step A17 in FIG. 12) executed by the second fault propagation path simple retrieval means 60 will be described in detail with reference to FIGS. 11 and 13.

First, at step B1 in FIG. 13, the unprocessed-gate retrieval means 301 refers to the logic-circuit structure memory 41 and logic state memory 44 and retrieves an undetermined gate, the output signal of which is faulty, detected at step A8 in FIG. 12, and a gate, which has not yet undergone first simple retrieval of fault propagation path among gates on a signal-line input side, registered by the fault propagation path registration means 303.

The input signal line retrieval means 302 retrieves a signal line for which the logic state has not been inferred from among one or plural input signal lines of an unprocessed gate retrieved by the unprocessed-gate retrieval means 301 (step B2).

Next, the fault propagation path discrimination means 601 refers to the functions of gates that have been stored in the logic-circuit structure memory 41 and to the expected values of gate input/output terminals that have been stored in the logic state memory 44, and retrieves, from input signal lines retrieved by the input signal line retrieval means 302 at step B3, an input signal line for which there is a possibility that the output logic value of a gate will be rendered faulty (step B5).

The fault propagation path registration means 303 adopts the logic state of the signal line retrieved by the input signal line retrieval means 302 as a fault state and records this in the logic state memory 44 (step B4).

Thus, only a path that is included in a fan-in cone and that may possibly propagate a fault is traced in the input direction from an undetermined gate and can be registered as a fault propagation path.

A specific example will now be described with reference to FIG. 5 and FIGS. 10 to 14 to provide a more detailed explanation of the second embodiment of the present invention.

The initialization means 21 performs an initializing operation and then the logic states of signal lines in a circuit are inferred by the implication means 22, logic contradiction discrimination means 23, backtrack means 25, undetermined-gate retrieval means 26, retrieval means 27 for retrieving a line influenced by a fault propagation path, and logic value decision means 29. As a result of logic decisions and implications performed a certain number of times, fault propagation paths of the kind shown by way of example in FIG. 5 are inferred.

Next, if the number of implemented decisions has not exceeded the upper limit, an assumption of a logic state is made with regard to the input signal line of the undetermined gate A or B in FIG. 5 and a path on which a fault is being propagated continues to be inferred.

If the number of implemented decisions has exceeded the upper limit, the second fault propagation path simple retrieval means recursively traces, in an input direction, signal lines along which there is a possibility that a fault state will propagate to the output signal line of an undetermined gate, from undetermined gates A and B, and registers the traced signal lines as fault propagation paths.

By virtue of this processing, it is possible to infer faulty locations in a short time by executing high-speed simple retrieval of fault propagation paths during the course of inference processing in which logical decisions and implications require an extended period of time. In addition, processing time and inference precision can be adjusted by selecting the upper limit on the number of times decisions are rendered.

A specific operation according to the second embodiment of the invention will be described in detail with reference to FIGS. 8 to 13. A case in which the present invention is applied to the circuit shown in FIG. 8 will be described.

Consider a case where the expected values of the input/output terminals of a gate of interest and the logic values (L22=1, L23=1) of the output signal have been given as the initial state. Accordingly, L23 is the fault output.

First, the initialization means 21 sets the logic states and expected values of the input/output terminals and signal lines. The initialization means 21 sets the following: L1=X[1], L2=X[1], L3=X[1], L6=X[1], L7=X[1], L22=1[1], L23=1 step A1). The numerals enclosed by the brackets represent the expected values. The initialization means 21 initializes the decision level (dlevel) (step A2) and then sets the allowable value (dmax) of the decision level (step A3). Here the allowable value of the decision level is set to 1.

Next, at step A4 in FIG. 3, the implication means 22 finds the logic value of a signal line in the logic circuit. Here a signal line is not implicated by L22=1, and L23=1. Since a logic contradiction does not occur, the logic contradiction discrimination means 23 judges that there is no logic contradiction (step A5).

Since a fault propagation path that will cause a fault output at L23 is not found, the processing-end discrimination means 24 determines that processing is not finished (step A6) and control therefore proceeds to step A7.

NAND gates G22 and G23, for which the output signals are "1" and for which the input signals have not yet been inferred as being "0", are retrieved as undetermined gates by the undetermined-gate retrieval means 26 at step A7.

At step A8 the retrieval means 27 for retrieving a line influenced by a fault propagation path selects L16as a signal line for which a logic value has not been determined. The selection is made from the input signal lines of undetermined gate G23 having the fault signal as its output signal.

Since the decision level (dlevel=0) has not reached the limit value (dmax=1), control proceeds from step A9 to step A10.

The logic value of the signal line detected at step A8 is decided to be "0" and the decision level is incremented (step A10).

By virtue of the implication operation performed at step A4, L2=1 and L11=1 are implicated at G16 from L16=0.

A logic contradiction is not detected at step A5 and the inferring of logic states is not finished. Control proceeds to step A7 as a result.

A gate G11 is detected as an undetermined gate at step A7. Since a fault signal has been inferred as the output signal of gate G11, the input signal line L3 thereof is selected at step A8.

Now the decision level is 1 and, hence, the limit value (dmax=1) has been reached. At step A9, therefore, it is judged that the limit value has been reached ("YES" at step A9). Control proceeds to step A11.

The unprocessed-gate retrieval means 301 retrieves G11 at step B1 in FIG. 13.

Since an unprocessed gate is retrieved, control proceeds to step B3.

The input signal line retrieval means 302 retrieves L3, L6, for which logic values have not been decided, as the input signal lines of gate G11 (B3).

In fault propagation path discrimination means 601, since there is a possibility that an input-output signal line having a possibility to make the output signal a faulty state L1=1 are both L3 and L6=0, both L3 and L6 are retrieved(at step B5).

Next, at step B4, L3 and L6 are registered in the logic state memory 44 as fault signal lines.

Since all unprocessed gates have been processed, first simple retrieval of fault propagation paths is ended and control proceeds to the next process.

Since all logic states have been determined, it is judged at step A6 that the inferring of logic states is finished and control proceeds to step A12.

The logic value comparison means 31 extracts a signal line whose state is different from that of the expected value, i.e., extracts a fault propagation path (step A12). As a result, L3, L6, L11, L16, and L23 are extracted as the fault propagation paths.

Furthermore, among the fault propagation paths, L3, L11, L16, and L23 are fault propagation paths that have a direct influence upon the fault output terminal when a fault exists on the path. Therefore the extraction means 32 for extracting a line related to a fault outputs these paths to the output unit 5 (step A13).

Since L16 has not been decided to be "1" as a decided line, it is determined at step A14 that processing is not finished and, hence, control proceeds to step A15.

The state that prevailed immediately prior to the decision on L16 is restored by the backtrack means 25. Accordingly, the decision level becomes 0 and the signal lines for which logic values have been decided become L22=1 and L23=1 (step A15). Now a decision to the effect that L16=1 holds is rendered and the decision level becomes dlevel=1 (step A16).

Next, the logic value of the signal line in the logic circuit is found by implication means 22 at step A4. By virtue of the implication operation at G16, L16=1 is implicated.

Thereafter, L10=0 is implicated at G22, L1=1 and L3=1 at G10, L19=0 at G23, L7=1 and L11=1 at G19, and L6=0 at G11. Thus the logic values of all signal lines are found.

A contradiction is not detected at step A5 and the inferring of logic states ends. Control then proceeds to step A12.

A comparison with expected values is made by the logic value comparison means 31 at step A12, whereby L2, L6, L11, L19 and L23 are extracted as the fault propagation paths.

Since all of these paths are capable of propagating a fault state to the fault output terminal L23, these paths are output to the output unit 5 (step A13).

The tree structure of the processing in the case of this embodiment is the same as that (FIG. 9) of the first embodiment. The number of times a logic decision is rendered is one only. When two or more decisions are required, simple path retrieval is used. This makes it possible to find fault propagation paths at high speed.

Third Embodiment

A third preferred embodiment of the present invention will now be described in detail with reference to the drawings.

Figure 15:
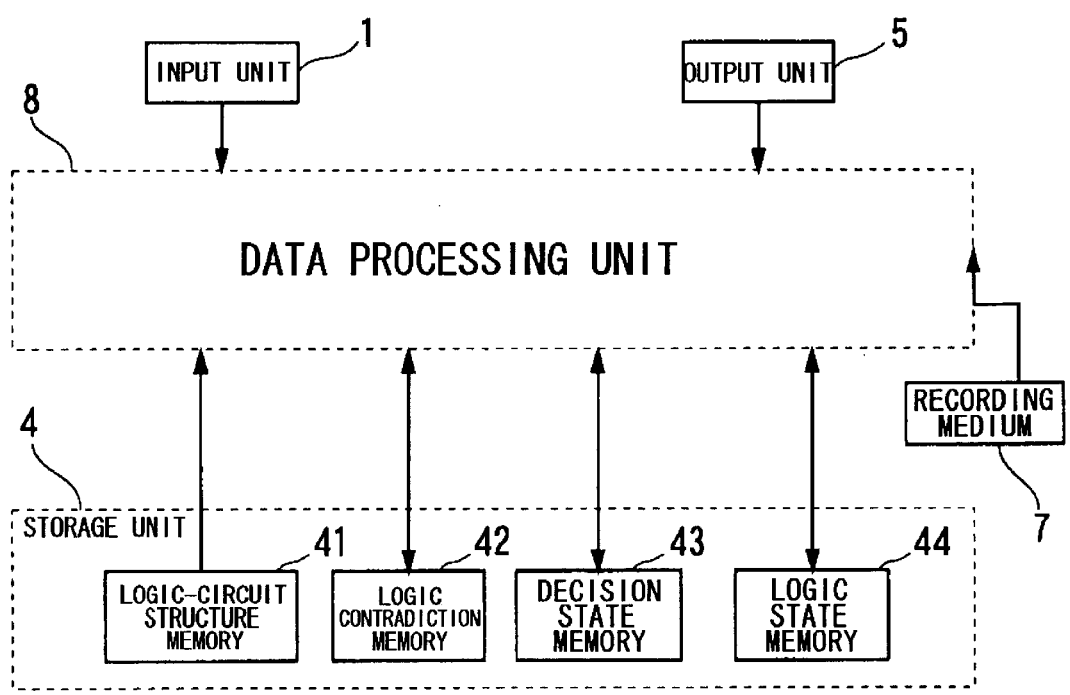
FIG. 15 is a block diagram illustrating the structure of a third embodiment of the present invention.

FIG. 15 is a block diagram illustrating the structure of a third embodiment of the present invention. As shown in FIG. 15, the fault propagation path inferring system according to the third embodiment is implemented by a program (a fault propagation path inferring program) executed by a data processing unit 8, and the system is provided with a recording medium 7 on which the program has been recorded. The recording medium 7 may be a magnetic disk, an optical disk, a magnetic tape, a semiconductor memory or any other recording medium.

The fault propagation path inferring program is read into the data processing unit 8 from the recording medium 7 and controls the operation of the data processing unit 8. Under the control of the fault propagation path inferring program, the data processing unit 8 executes processing set forth below, namely processing identical with that executed by the data processing unit 2 of the first and second embodiments.

When the logic states of input/output terminals of a combinational circuit are provided by the input unit 1, the logic states of the input/output terminals are set and the logic states of the signal lines are initialized.

The logic states of signal lines are inferred by repeating implications and decisions while referring to the decision state memory 43 and logic state memory 44.

If the number of decisions rendered exceeds the predetermined upper limit, simple retrieval of fault propagation paths is performed by the first fault propagation path simple retrieval means 30 or second fault propagation path simple retrieval means 60.

If the logic states of all signal lines have been inferred, the logic state of each signal line stored in the logic state memory is compared with an expected value, whereby a fault propagation path is extracted, and only a fault propagation path that is related to a fault output terminal is displayed on the output unit 5.

Fourth Embodiment

A fourth preferred embodiment of the present invention will now be described in detail with reference to the drawings.

FIG. 19 is a block diagram illustrating the structure of a fourth embodiment of the present invention. As shown in FIG. 19, the fourth embodiment differs from the first embodiment in that the data processing unit 2 of the first embodiment shown in FIG. 1 is provided with decision-limit altering means 33.

The decision-limit altering means 33 determines whether a predetermined decision-limit reset condition has been satisfied and, if this condition has been satisfied, resets the upper-limit value (dmax) on decisions and restores a logic state to a logic state where the number of times (dlevel) a decision is rendered falls below the decision limit value (dmax) that has been reset. The decision-limit altering means 33 does not perform any operation if the decision-limit reset condition has not been satisfied or if the limit value (dmax) on decisions is the same as the value that is about to be reset.

Figure 20:
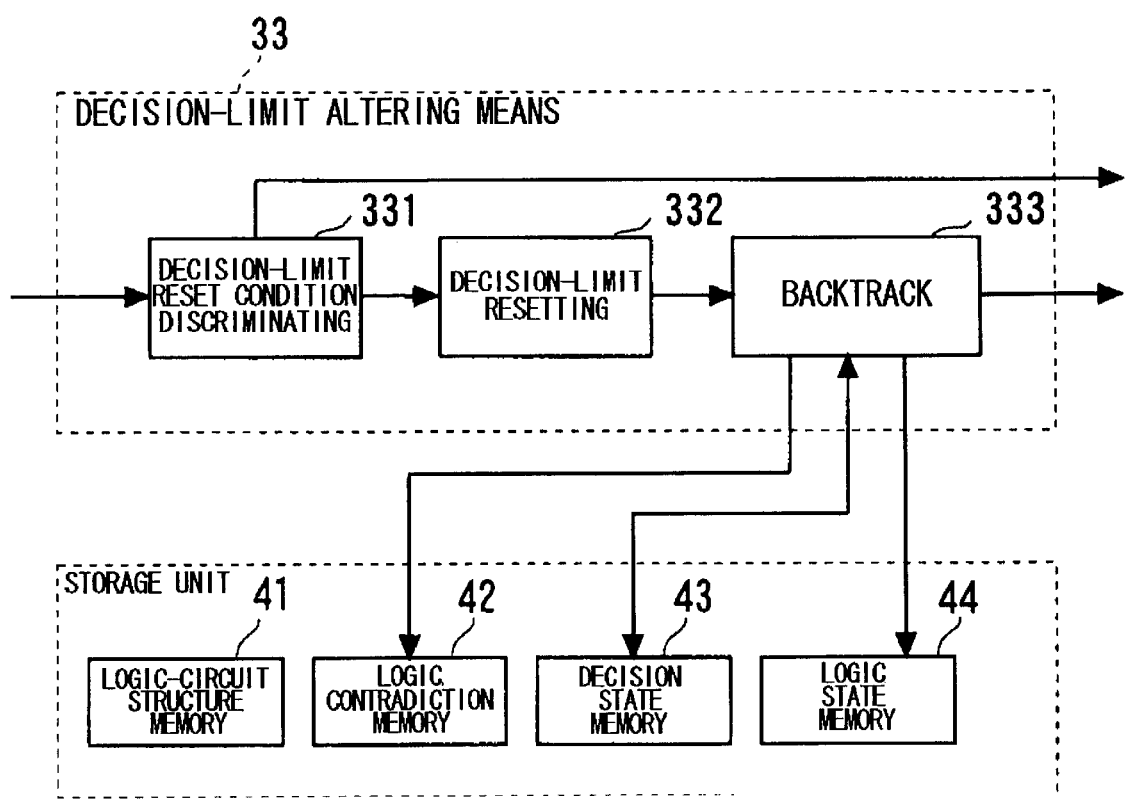
FIG. 20 is a block diagram illustrating the structure of decision-limit altering means according to the fourth embodiment.

FIG. 20 is a block diagram showing the structure of the decision-limit altering means 33 according to the fourth embodiment. As shown in FIG. 20, the decision-limit altering means 33 includes decision-limit reset condition discrimination means 331, decision-limit resetting means 332 and backtrack means 333.

As in the first embodiment, the storage unit 4 includes the logic-circuit structure memory 41, logic contradiction memory 42, decision state memory 43 and logic state memory 44.

The decision-limit reset condition discrimination means 331 determines whether a predetermined decision-limit reset condition has been satisfied. For example, in a case where it has been decided that the decision limit value will be reset if inference processing time has exceeded an upper-limit value, the decision-limit reset condition discrimination means 331 determines whether the inference processing time has exceeded the predetermined upper-limit value. If the result of the determination is that the processing time has not exceeded the upper-limit value, the processing of the decision-limit altering means 33 is terminated. If the upper-limit value has been exceeded, control proceeds to processing by the decision-limit resetting means 332.

In addition to inference processing time, the following conditions or a combination thereof may be used as a decision-limit reset condition: number of fault propagation paths inferred, number of processed patterns, load on the fault propagation path inferring system of the present invention, a rise in temperature and receipt of a signal from the user indicating a change in the decision-limit reset.

Further, resetting of the decision-limit value is not limited to a single time; it is possible to change the decision-limit value (dmax) in accordance with a predetermined rule. For example, an arrangement may be adopted in which the decision-limit value is changed in stages in accordance with inference processing in order that inference processing will be executed with a practical period of time.

The decision-limit resetting means 332 resets the decision-limit value in accordance with a predetermined rule.

The backtrack means 333 refers to the decision state storage unit 43 to retrieve the present decision state. If the number of times (dlevel) decisions have been made exceeds the limit value (dmax) reset by the decision-limit resetting means 332, the backtrack means 333 refers to the logic states of signal lines stored in the logic state storage unit 44, erases the logic state of a decision level for which inference processing has already ended, a history of implications as well as logic contradictions, and restores the logic state of each signal line to a logic state that prevailed before the number of decisions exceeded the decision limit value (dmax).

Figure 21:
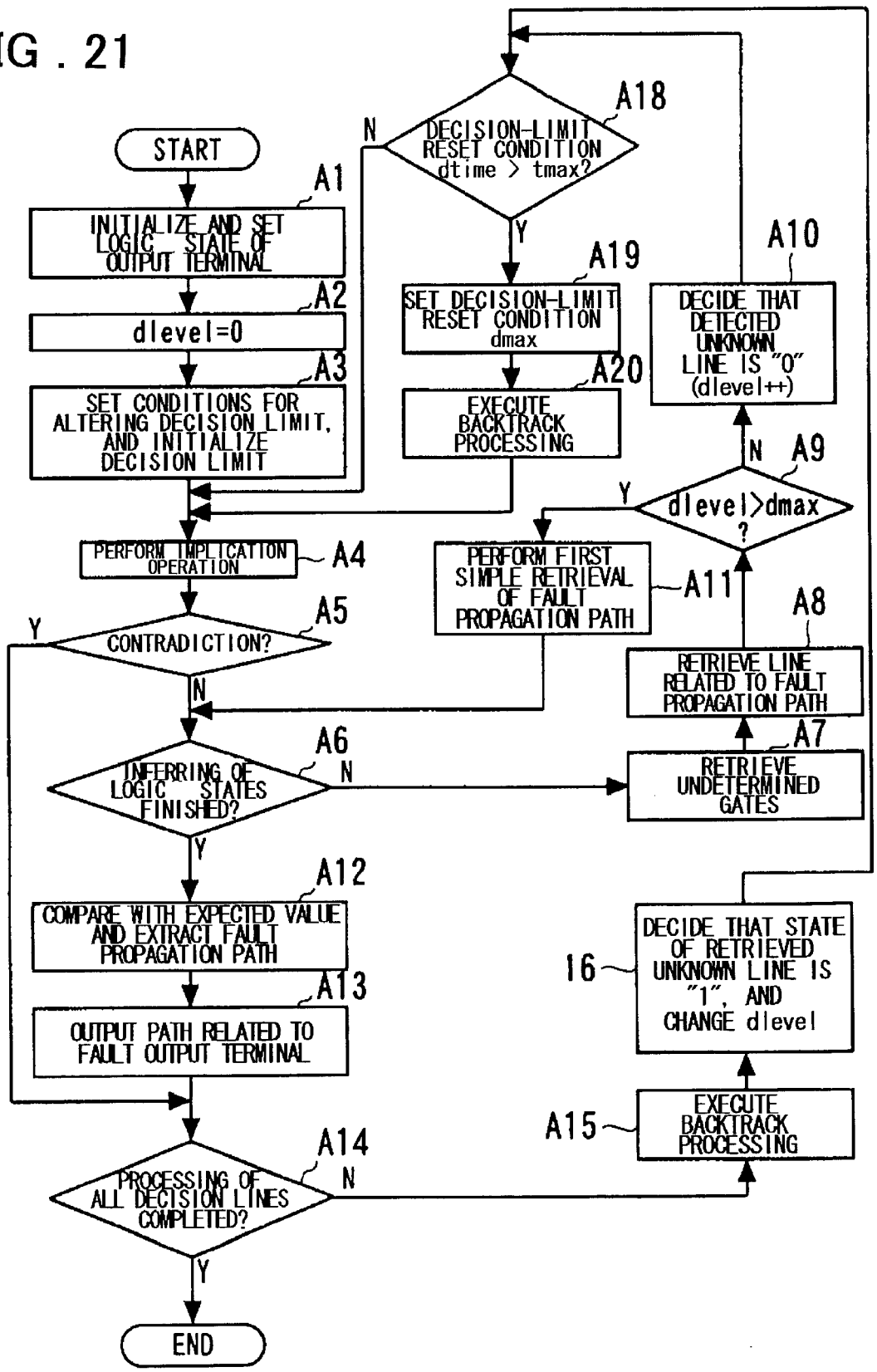
FIG. 21 is a flowchart illustrating the operation of the fourth embodiment.

FIG. 21 is a flowchart for describing system operation according to the fourth embodiment of the present invention. This embodiment will be described in detail with reference to FIGS. 19 to 21.

Means 21 to 32 in the fourth embodiment and the operations thereof indicated at steps A1 to A16 in FIG. 21, i.e., means other than decision-limit altering means 33 and operation thereof in the data processing unit 2 of the fourth embodiment, are the same as the means 21 to 32 in the first embodiment and the operations thereof (steps A1 to A16 in FIG. 3). A description thereof, therefore, is omitted.

The decision-limit altering means 33 (steps A18 FIG. 21) will be described in detail with reference to FIGS. 19 and 20.

At step A18 in FIG. 21, the decision-limit reset condition discrimination means 331 determines whether the predetermined decision-limit reset condition has been satisfied. For example, in a case where it has been decided that the decision limit value will be reset if inference processing time has exceeded the upper-limit value, the decision-limit reset condition discrimination means 331 determines whether the inference processing time has exceeded the predetermined upper-limit value. If the upper-limit value on processing time has not been exceeded, processing by the decision-limit altering means 33 is terminated and control shifts to the implication operation of step A4. If the upper-limit value on processing time has been exceeded, then control proceeds to step A19, at which the decision limit value is reset.

The decision-limit resetting means 332 resets the decision limit value in accordance with a predetermined rule at step A19.

The backtrack means 333 refers to the decision state storage unit 43 to retrieve the present decision state at step A20. If the number of decisions (dlevel) exceeds the limit value (dmax) reset by the decision-limit resetting means 332, the backtrack means 333 refers to the logic states of signal lines stored in the logic state storage unit 44, erases the logic state of a decision level for which inference processing has already ended, a history of implications as well as logic contradictions, and restores the logic state of each signal line to a logic state that prevailed before the number of decisions exceeded the decision limit value (dmax).

Thus, if inference processing exceeds a condition conceived of by the user, a switch is made to simple retrieval of fault propagation path, thereby making it possible to infer fault propagation paths at high speed.

The fault propagation path inference system is used when, in testing an LSI device, a test pattern is applied to the LSI device under test, an abnormal response (fail log) is obtained and fault propagation paths of the LSI are inferred by using the fail log. Ordinarily, therefore, the logic states of input/output terminals of the logic circuit are not a single set (one pattern); logic states of a plurality of sets (a plurality of patterns) are applied.

Since processing time is dependent upon the size of the logic circuit, the faulty location and the applied pattern, processing time differs for every pattern.

Depending upon the applied pattern, a logic contradiction is detected immediately in an implication operation regardless of the fact that decisions are rendered a number of times in detailed inferring of fault propagation paths based upon logic value decisions and implications. If there are fault propagation paths that can be inferred at high speed, therefore, there will be fault propagation paths for which decisions are few but processing time is long.

Inference precision is higher in the case of detailed inferring of fault propagation paths. Accordingly, the decision limit values in all patterns are not made the same. A condition such as a time limit is provided, as in the fourth embodiment of the invention, and detailed inferring of fault propagation paths is carried out in a first stage. Then, when the predetermined condition is satisfied, simple inferring of fault propagation paths is carried out. This expedient will make it possible to deal with a variety of patterns, such as a pattern that can be processed in a short time even though the number of decisions rendered is large. The end result is that a highly precise inference is possible in a short period of time.

Further, as shown in FIG. 15 referred to in the description of the third embodiment, it is permissible to adopt an arrangement in which the program for inferring fault propagation paths is read into the data processing unit 8 from the recording medium 7, the operation of the data processing unit 8 is controlled and, in the data processing unit 8, processing is executed that is identical with that of the decision-limit altering means 33 of data processing unit 2 in the fourth embodiment described above. If the decision-limit reset condition has not been satisfied, the decision-limit altering means 33 does not perform simple retrieval of fault propagation paths and processing for continuing logical decisions and implications is executed. In other words, the fault propagation path inferring program of the third embodiment read into the data processing unit 8 from the recording medium 7 further includes a program that causes the data processing unit 8 (see FIG. 15) to execute the processing of the decision-limit altering means 33 performed at steps A FIG. 21.

The meritorious effects of the present invention are summarized as follows.

The present invention as described above provides a number of effects, which will now be set forth.

One meritorious effect of the present invention is that high-speed processing becomes possible in the inferring of fault propagation paths that is based upon processing in which logical decisions and implications are repeated.

The reason for this is that in the present invention, an upper limit is set on the number of times logic decisions are rendered and a switch is made from detailed inference processing, which is based upon repetition of logical decisions and implications, to simple inference processing.

A second meritorious effect of the present invention is that fault propagation paths that include an actual fault can be inferred even if inference processing is suspended.

The reason for this is that in the present invention, fault propagation paths are inferred in simple fashion in the input direction from an undetermined gate when detailed inference processing, which is based upon repetition of logical decisions and implications, is suspended.

A third meritorious effect of the present invention is that inference precision and processing time can be adjusted in the inferring of fault propagation paths.

The reason for this is that in the present invention, it is possible to adjust inference precision and processing time by setting an upper limit on the number of times logical decisions are rendered. That is, if the upper limit on the number of decisions is set high, inference precision improves but processing time lengthens. If the upper limit on the number of decisions is set low, on the other hand, inference precision declines but processing time is curtailed.

A fourth meritorious effect of the present invention is that more precise inference can be achieved in a short period of time in a case where a plurality of patterns are processed in the inferring of fault propagation paths.

The reason for this is that in the present invention, the upper limit on number of logical decisions is reset in accordance with processing time. For a pattern requiring a long processing time, a switch is made to simple retrieval of fault propagation paths. For a pattern that can be processed in a short time, on the other hand, processing for detailed inferring of fault propagation paths in which logical decisions and implications are repeated is executed.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A fault propagation path inference system for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising:

decision-limit discrimination means for providing an upper limit on a decision level that represents a number of logic state decisions and, if the number of logic state decisions exceeds the upper limit on the decision level, switching the logic state decision to simple retrieval of a fault propagation path; and fault propagation path simple retrieval means for extracting a fan-in cone by tracing a net-list of the combinational logic circuit in an input direction from an undetermined gate whose output signal is faulty and whose input/output signal lines have a signal line the logic state of which is unknown, and registering, as a fault propagation path, a signal line, which is included in the fan-in cone, the logic state of which has not been decided.

2. A fault propagation path inference system for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising:

unprocessed-gate retrieval means for retrieving an unprocessed gate, which has not undergone simple retrieval of a fault propagation path, from among one or plural undetermined gates whose output signals are faulty and whose input/output signal lines have a signal line the logic state of which is unknown;

input signal line retrieval means for retrieving a signal line, for which the logic state has not been determined, from among one or plural input signal lines of the unprocessed gate; and fault propagation path registration means for adopting the logic state of the retrieved signal line as a fault state and recording the logic state of said signal line in a logic state memory.

3. A fault propagation path inference system for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising:

decision-limit discrimination means for providing an upper limit on a decision level that represents a number of logic state decisions and, if the number of logic state decisions exceeds the upper limit on the decision level, switching the logic state decision to simple retrieval of a fault propagation path; and fault propagation path simple retrieval means for tracing, in an input direction, a signal line along which there is a possibility that a fault state will propagate to an undetermined gate, while referring to expected values of signal lines and to gate function, from an undetermined gate whose output signal is faulty and whose input/output signal lines have a signal line the logic state of which is unknown, and registering the traced signal line as a fault propagation path.

4. A fault propagation path inference system for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising:

unprocessed-gate retrieval means for retrieving an unprocessed gate, which has not undergone simple retrieval of a fault propagation path, from among one or plural undetermined gates whose output signals are faulty and whose input/output signal lines have a signal line the logic state of which is unknown;

input signal line retrieval means for retrieving a signal line, for which the logic state has not been determined, from among one or plural the input signal lines of the unprocessed gate;

fault propagation path discrimination means for retrieving, from among one or plural retrieved input signal lines, an input signal line for which there is a possibility that an output logic state of a gate will be made a fault state, by referring to gate function and expected values of gate input/output terminals; and fault propagation path registration means for adopting the logic state of the retrieved signal line as a fault state and registering the logic state of the signal line in a logic state memory.

5. In a method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, a fault propagation path extraction method comprising the steps of:

providing an upper limit on a decision level that represents a number of logic state decisions and switching to simple retrieval of a fault propagation path, at which processing is executed at high speed, if the decision level exceeds the upper limit; and extracting a fan-in cone by tracing a net list of the combinational logic circuit in an input direction from an undetermined gate whose output signal is faulty and whose input/output signal lines have a signal line the logic state of which is unknown, and registering, as a fault propagation path, a signal line, which is included in the fan-in cone, the logic state of which has not been decided.

6. In a method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, a fault propagation path simple retrieval method comprising the steps of:

retrieving an unprocessed gate, which has not undergone simple retrieval of a fault propagation path, from among one or plural undetermined gates whose output signals are faulty and whose input/output signal lines have a signal line the logic state of which is unknown; and retrieving a signal line, for which the logic state has not been determined, from among one or plural input signal lines of the unprocessed gate, and adopting the logic state of the retrieved signal line as a fault state and recording the logic state of the signal line in a logic state memory.

7. A fault propagation path inferring method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said method comprising the steps of:

determining whether a predetermined decision-limit reset condition has been satisfied and, if said condition has been satisfied, resetting a decision level that represents a number of logic state decisions and restoring the logic state to a logic state where the number of decisions falls below a decision limit value that has been reset;

providing an upper limit on the decision level that represents the number of logic state decisions and, if the number of logic state decisions exceeds the upper limit of the decision level, switching the logic state decision to simple retrieval of a fault propagation path; and performing the simple retrieval of a fault propagation path set forth in claim 6.

8. In a method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, a fault propagation path extraction method comprising the steps of:

provding an upper limit on a decision level that represents a number of logic state decisions and switching to simple retrieval of a fault propagation path, at which processing is executed at high speed, if the decision level exceeds the upper limit; and tracing, in an input direction, a signal line along which there is a possibility that a fault state will propagate to an undetermined gate, while referring to expected values of the signal lines and to gate function, from an undetermined gate whose output signal is faulty and whose input/output signal lines have a signal line the logic state of which is unknown, and registering the traced signal line as a fault propagation path.

9. In a method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, a fault propagation path simple retrieval method comprising the steps of:

retrieving an unprocessed gate, which has not undergone simple retrieval of a fault propagation path, from among one or plural undetermined gates whose output signals are faulty and whose input/output signal lines have a signal line the logic state of which is unknown, and retrieving a signal line, for which the logic state has not been determined, from among one or plural input signal lines of the unprocessed gate; and retrieving, from the retrieved one or plural input signal lines, an input signal line for which there is a possibility that an output logic state of a gate will be made a fault state, by referring to gate function and expected values of gate input/output terminals, and adopting the logic state of the retrieved signal line as a fault state and registering the logic state of the signal line in a logic state storage unit.

10. A fault propagation path inferring method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said method comprising the steps of:

determining whether a predetermined decision-limit reset condition has been satisfied and, if said condition has been satisfied, resetting a decision level that represents a number of logic state decisions and restoring the logic state to a logic state where the number of decisions falls below a decision limit value that has been reset;

providing an upper limit on the decision level that represents the number of logic state decisions and, if the number of logic state decisions exceeds the upper limit of the decision level, switching the logic state decision to simple retrieval of a fault propagation path; and performing the simple retrieval of a fault propagation path set forth in claim 9.

11. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer of execute the following processing:

decision-limit discriminating processing for providing an upper limit on a decision level that represents a number of logic state decisions and switching to simple retrieval of a fault propagation path, at which processing is executed at high speed, if the decision level exceeds the upper limit; and fault propagation path simple retrieval processing for extracting a fan-in cone by tracing a net-list of the combinational logic circuit in an input direction from an undetermined gate whose output signal is faulty and whose input/output signal lines have a signal line the logic state of which is unknown, and registering, as a fault propagation path, a signal line, which is included in the fan-in cone, the logic state of which has not been decided.

12. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer to execute the following processing:

unprocessed-gate retrieval processing for retrieving an unprocessed gate, which has not undergone simple retrieval of a fault propagation path, from among one or plural undetermined gates whose output signals are faulty and whose input/output signal lines have a signal line the logic state of which is unknown;

input signal line retrieval processing for retrieving a signal line, for which the logic state has not been determined, from among the input signal lines of the unprocessed gate; and fault propagation path registration processing for adopting the logic state of the retrieved signal line as a fault state and recording the state of the signal line in a logic state memory.

13. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer to execute the following processing:

decision-limit altering processing for determining whether a predetermined decision-limit reset condition has been satisfied and, if said condition has been satisfied, resetting a decision level that represents a number of logic state decisions and restoring the logic state to a logic state where the number of decisions falls below a decision limit value that has been reset;

decision-limit discriminating processing for providing an upper limit on the decision level that represents the number of logic state decisions and, if the number of logic state decisions exceeds the upper limit of the decision level, switching the logic state decision to simple retrieval of a fault propagation path; and the fault propagation path simple retrieval processing set forth in claim 12.

14. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer of execute the following processing:

decision-limit altering processing for determining whether a predetermined decision-limit reset condition has been satisfied and, if said condition has been satisfied, resetting a decision level that represents a number of logic state decisions and restoring the logic state to a logic state where the number of decisions falls below a decision limit value that has been reset;

decision-limit discriminating processing for providing an upper limit on the decision level that represents the number of logic state decisions and, if the number of logic state decisions exceeds the upper limit of the decision level, switching the logic state decision to simple retrieval of a fault propagation path; and the fault propagation path simple retrieval processing set forth in claim 12.

15. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer to execute the following processing:

decision-limit discriminating processing for providing an upper limit on a decision level that represents a number of logic state decisions and switching to simple retrieval of a fault propagation path, at which processing is executed at high speed, if the decision level exceeds the upper limit; and fault propagation path simple retrieval processing for tracing, in an input direction, a signal line along which there is a possibility that a fault state will propagate to an undetermined gate, while referring to expected values of signal lines and to gate function, from an undetermined gate whose output signal is faulty and whose input/output signal lines have a signal line the logic state of which is unknown, and registering the traced signal lines as fault propagation paths.

16. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer to execute the following processing:

unprocessed-gate retrieval processing for retrieving an unprocessed gate, which has not undergone simple retrieval of a fault propagation path, from among one or plural undetermined gates whose output signals are faulty and whose input/output signal lines have a signal line the logic state of which is unknown;

input signal line retrieval processing for retrieving a signal line, for which the logic state has not been determined, from among one or plural input signal lines of the unprocessed gate;

fault propagation path discriminating processing for retrieving, from one or plural retrieved input signal lines, an input signal line for which there is a possibility that an output logic state of a gate will be made a fault state, by referring to gate function and expected values of gate input/output terminals; and fault propagation path registration processing for adopting the logic state of the retrieved signal line as a fault state and registering the logic state of the signal line in a logic state memory.

17. A fault propagation path inferring method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said method comprising the steps of:

(a) setting logic states of input/output terminals of the combinational circuit provided by an input unit, initializing a decision level that represents a number of logic state decisions, and setting an upper-limit value on the decision level;

(b) performing an implication operation for inferring logic states of input/output lines of an un-inferred gate from logic states of input/output signal lines of an already inferred gate at each gate in the combinational logic circuit, recording the inferred logic states in a logic state memory, and recording the decision level and a history of implications in a decision state memory;

(c) if a logic contradiction in the implication operation has not exceeded an allowable number, referring to logic states of signal lines that have been stored in the logic state memory and determining whether the logic states of all signal lines have been inferred to be a first logic value, a second logic value or "don't care";

(d) if inferring of logic states of all signal lines is not finished, examining the logic states of input/outputs of gates in the combinational logic circuit and retrieving undetermined gates the logic state of which is incomplete;

(e) retrieving an undetermined gate, which has an output signal for which a fault state has been inferred, from the retrieved undetermined gates by referring to a logic circuit structure that has been stored in a logic-circuit structure memory and to the logic state of each signal line that has been stored in the logic state memory;

(f) determining whether the decision level has exceeding the upper-limit value;

(g) if the decision level has not exceeded the upper-limit value, deciding that a signal line that has been detected in logic value decision means is at the first logic value, incrementing the decision level, which represents the number of decisions, and returning processing to said step (b);

(h) executing fault propagation path simple retrieval comprising the following steps:

if the decision level has exceeded the upper-limit value, retrieving an unprocessed gate, which has not undergone simple retrieval of a fault propagation path, from among one or plural undetermined gates whose output signals are faulty and whose input/output signal lines have a signal line the logic state of which is unknown;

retrieving a signal line, for which the logic state has not been determined, from among one or plural input signal lines of the unprocessed gate; and adopting the logic state of the retrieved signal line as a fault state and recording the logic state of the signal line in the logic state memory;

(i) if it is determined that the logic states of all signal lines have been inferred, extracting signal lines having logic states different from those of expected values as fault propagation paths, extracting from the fault propagation paths a fault propagation path that will have a direct influence upon a fault output terminal when a fault exists on the path, and outputting the fault propagation path to an output unit;

(j) determining whether decision processing with regard to both the first and second logic values is finished for all decision lines that have been decided;

(k) if it has been determined that decision processing is not finished, retrieving by backtrack processing a decision line for which it has not been decided that the logic state is the second logic value, deciding that the state of the decision line is the second logic value, and returning the implication operation of said step (b); and (l) if it has been determined that decision processing is finished, terminating processing for extracting a fault propagation path.

18. A fault propagation path inferring method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said method comprising the steps of:

(a) setting logic states of input/output terminals of the combinational circuit provided by an input unit, initializing a decision level that represents a number of logic state decisions, and setting an upper-limit value on the decision level;

(b) performing an implication operation for inferring logic states of input/output lines of an un-inferred gate from logic states of input/output signal lines of an already inferred gate at each gate in the combinational logic circuit, recording the inferred logic states in a logic state memory, and recording the decision level and a history of implications in a decision state memory;

(c) if a logic contradiction in the implication operation has not exceeded an allowable number, referring to logic states of signal lines that have been stored in the logic state memory and determining whether the logic states of all signal lines have been inferred to be a first logic value, a second logic value or "don't care";

(d) if inferring of logic states of all signal lines is not finished, examining the logic states of input/outputs of gates in the combinational logic circuit and retrieving undetermined gates the logic state of which is incomplete;

(e) retrieving an undetermined gate, which has an output signal for which a fault state has been inferred, from the retrieved undetermined gates by referring to a logic circuit structure that has been stored in a logic-circuit structure memory and to the logic state of each signal line that has been stored in the logic state memory;

(f) determining whether the decision level has exceeding the upper-limit value;

(g) if the decision level has not exceeded the upper-limit value, deciding that a signal line that has been detected in logic value decision means is at the first logic value, incrementing the decision level, which represents the number of decisions, and returning processing to said step (b);

(h) executing fault propagation path simple retrieval comprising the following processing:

if the decision level has exceeded the upper-limit value, retrieving an unprocessed gate, which has not undergone simple retrieval of a fault propagation path, from among one or plural undetermined gates whose output signals are faulty and whose input/output signal lines have a signal line the logic state of which is unknown;

retrieving a signal line, for which the logic state has not been determined, from among one or plural input signal lines of the unprocessed gate; and retrieving, from the retrieved one or plural input signal lines, an input signal line for which there is a possibility that an output logic state of a gate will be made a fault state, by referring to gate function and expected values of gate input/output terminals; and adopting the logic state of the retrieved signal line as a fault state and recording the logic state of the signal line in the logic state memory;

(i) if it is determined that the logic states of all signal lines have been inferred, extracting one or plural signal lines having logic states different from those of expected values as fault propagation paths, extracting from the fault propagation paths a fault propagation path that will have a direct influence upon a fault output terminal when a fault exists on the path, and outputting the fault propagation path to an output unit;

(j) determining whether decision processing with regard to both the first and second logic values is finished for all decision lines that have been decided;

(k) if it has been determined that decision processing is not finished, retrieving by backtrack processing a decision line for which it has not been decided that the logic state is the second logic value, deciding that the state of the decision line is the second logic value, and returning the implication operation of said step (b); and (l) if it has been determined that decision processing is finished, terminating processing for extracting fault propagation paths.

19. A fault propagation path inference device comprising:

a logic-circuit structure memory for storing structure and connection information of a logic circuit;

a logic contradiction memory for storing gates in which one or plural logic contradictions have occurred during implication processing and the number of times logic contradictions have occurred;

a decision state memory for storing a decision level that prevails when logic states of respective ones of signal lines are inferred by implication;

a logic state memory for storing the logic state of each signal line, a history of implications and an expected value, which is a logic state, of each signal line prevailing when a combinatorial logic circuit is normal;

initializing means for setting logic-circuit type and logic states of input/output terminals provided by an input unit, initializing logic states of signal lines of the logic circuit, initializing the decision level and setting an upper-limit value thereof;

implication means for referring to a logic circuit structure that has been stored in said logic-circuit structure memory and to the logic state of each signal line that has been stored in said logic state memory, performing an implication operation at a gate connected to an input/output signal line set by said initialization means and at a gate connected to a signal line decided by the logic value decision means, inferring the logic states of gate input/output signal lines and, if a logic value has been inferred anew, recording the logic value and history of implication in said logic state memory and recording the decision level in said decision state memory, said decision level indicating under how many decisions the inference was made;

logic contradiction determination means for referring to said logic contradiction memory and determining whether number of logic contradictions of signal lines detected by said implication means has exceeded a predetermined allowable number;

processing-end discrimination means for referring to the logic state of each signal line stored in said logic state memory and determining whether the logic states of all signal lines have been inferred;

backtrack means for referring to states of decision stored in said decision state memory and to the logic states of signal lines stored in said logic state memory, erasing the logic state of a decision level for which processing has been completed as well as the history of implications and logic contradictions, and restoring the logic state of each signal line back to the logic state that prevailed prior to the rendering of the decision;

undetermined-gate retrieval means for examining the logic states of input/outputs of gates in the logic circuit and retrieving gates the logic state of which is incomplete;

fault propagation path influenced line retrieval means for retrieving an undetermined gate, which has an output signal for which a fault state has been inferred, from the undetermined gates retrieved by said undetermined-gate retrieval means, by referring to a logic circuit structure that has been stored in said logic-circuit structure memory and to the logic state of each signal line that has been stored in said logic state memory;

decision-limit discrimination means for determining whether the next decision exceeds a predetermined upper-limit value on decisions;

logic value decision means for deciding a logic state by selecting an input signal line of an undetermined gate for which the output signal is faulty, said undetermined gate having been detected by said fault propagation path influenced line retrieval means;

fault propagation path simple retrieval means for extracting a fan-in cone by tracing a circuit in an input direction from an undetermined gate, and registering all signal lines, for which the logic state has not been decided among paths included in the fan-in cone, as fault propagation paths in said logic state memory;

logic value comparison means for comparing the obtained logic state of each signal line with an expected value representing the logic state of each signal line found by logic simulation in a normal circuit, and extracting a fault propagation path; and fault output terminal related line extraction means for extracting, from one or plural fault propagation paths that have been extracted by said logic value comparison means, a fault propagation path that will have a direct influence upon a fault output terminal when a fault exists on the path, and outputting data to an output unit.

20. The fault propagation path inference device as defined in claim 19, wherein said fault propagation path simple retrieval means includes unprocessed-gate retrieval means, input signal line retrieval means and fault propagation path registration means;

said unprocessed gate retrieval means referring to said logic-circuit structure memory and to said logic state memory and retrieving an undetermined gate, the output signal of which is faulty, detected by said fault propagation path influenced line retrieval means, and a gate, which has not yet undergone simple fault propagation path retrieval among gates on a signal-line input side, registered by said fault propagation path registration means;

said input signal line retrieval means retrieving a signal line for which the logic state has not been determined from among one or plural input signal lines of the unprocessed gate retrieved by said unprocessed-gate retrieval means; and said fault propagation path registration means adopting the logic state of the signal line retrieved by said input signal line retrieval means as a fault state and recording the logic state of the signal line in said logic state memory.

21. A fault propagation path inference device comprising:

a logic-circuit structure memory for storing structure and connection information of a logic circuit;

a logic contradiction memory for storing gates in which logic contradictions have occurred during implication processing and the number of times logic contradictions have occurred;

a decision state memory for storing a decision level that prevails when logic states of respective ones of signal lines are inferred by implication;

a logic state memory for storing the logic state of each signal line, a history of implications and an expected value, which is a logic state, of each signal line prevailing when a combinatorial logic circuit is normal;

initializing means for setting logic-circuit type and logic states of input/output terminals provided by an input unit, initializing logic states of signal lines of the logic circuit, initializing the decision level and setting an upper-limit value thereof;

implication means for referring to a logic circuit structure that has been stored in said logic-circuit structure memory and to the logic state of each signal line that has been stored in said logic state memory, performing an implication operation at a gate connected to an input/output signal line set by said initialization means and at a gate connected to a signal line decided by the logic value decision means, inferring the logic states of gate input/output signal lines and, if a logic value has been inferred anew, recording the logic value and history of implication in said logic state memory and recording the decision level in said decision state memory, said decision level indicating under how many decisions the inference was made;

logic contradiction determination means for referring to said logic contradiction memory and determining whether number of logic contradictions of signal lines detected by said implication means has exceeded a predetermined allowable number;

processing-end discrimination means for referring to the logic state of each signal line stored in said logic state memory and determining whether the logic states of all signal lines have been inferred;

backtrack means for referring to states of decision steroids in said decision state memory and to the logic states of signal lines stored in said logic state memory, erasing the logic state of a decision level for which processing has been completed as well as the history of implications and logic contradictions, and restoring the logic state of each signal line back to the logic state that prevailed prior to the rendering of the decision;

undetermined-gate retrieval means for examining the logic states of input/outputs of gates in the logic circuit and retrieving gates the logic state of which is incomplete;

fault propagation path influenced line retrieval means for retrieving an undetermined gate, which has an output signal for which a fault state has been inferred, from the undetermined gates retrieved by said undetermined-gate retrieval means, by referring to a logic circuit structure that has been stored in said logic-circuit structure memory and to the logic state of each signal line that has been stored in said logic state memory;

decision-limit discrimination means for determining whether the next decision exceeds a predetermined upper-limit value on decisions;

logic value decision means for deciding a logic state by selecting an input signal line of an undetermined gate for which the output signal is faulty, said undetermined gate having been detected by said fault propagation path influenced line retrieval means;

fault propagation path simple retrieval means for tracing, in an input direction, a signal line along which there is a possibility that a fault state will propagate to an undetermined gate, while referring to expected values of signal lines and to gate function, from an undetermined gate whose output signal is faulty and whose input/output signal lines have a signal line the logic state of which is unknown, and registering the traced signal lines as fault propagation paths;

logic value comparison means for comparing the obtained logic state of each signal line with an expected value representing the logic state of each signal line found by logic simulation in a normal circuit, and extracting a fault propagation path; and fault output terminal related line extraction means for extracting, from the fault propagation paths that have been extracted by said logic value comparison means, a fault propagation path that will have a direct influence upon a fault output terminal when a fault exists on the path, and outputting data to an output unit.

22. The fault propagation path inference device as defined in claim 21, wherein said fault propagation path simple retrieval means includes unprocessed-gate retrieval means, input signal line retrieval means, fault propagation path determination means and fault propagation path registration means;

said unprocessed gate retrieval means referring to said logic-circuit structure memory and to said logic state memory and retrieving an undetermined gate, the output signal of which is faulty, detected by said fault propagation path influenced line retrieval means, and a gate, which has not yet undergone simple fault propagation path retrieval among gates on a signal-line input side, registered by said fault propagation path registration means;

said input signal line retrieval means retrieving a signal line for which the logic state has not been determined from among one or plural input signal lines of the unprocessed gate retrieved by said unprocessed-gate retrieval means;

said fault propagation path discrimination means referring to gate functions that have been stored in said logic-circuit structure memory and to expected values of gate input/output terminals that have been stored in said logic state memory, and retrieving, from input signal lines retrieved by said input signal line retrieval means, an input signal line for which there is a possibility that the output logic value of a gate will be rendered faulty; and said fault propagation path registration means adopting the logic state of the signal line retrieved by said fault propagation path discrimination means as a fault state and recording the logic state of the signal line in said logic state memory.

23. A fault propagation path inferring system for inferring a logic state in a combinational logic circuit by repeating logic state decisions and implications and comparing the logic states with expected values, which are logic states that prevail when the combinational logic circuit operates normally, thereby inferring a fault propagation path in the combinational logic circuit, comprising:

decision-limit altering means for determining whether a predetermined decision-limit reset condition has been satisfied and, if said condition has been satisfied, resetting a decision level that represents a number of logic state decisions and restoring the logic state to a logic state where the number of decisions falls below a decision limit value that has been reset;

decision-limit discrimination means for providing an upper limit on the decision level that represents the number of logic state decisions and, if the number of logic state decisions exceeds the upper limit of the decision level, switching the decision of logic states to simple retrieval of fault propagation paths; and either first fault propagation path simple retrieval means for extracting a fan-in cone by tracing a net list of the combinational logic circuit in an input direction from an undetermined gate whose output signal is faulty and whose input/output signal lines have a signal line the logic state of which is unknown, and registering, as fault propagation paths, signal lines, included in the fan-in cone, the logic states of which have not been decided; or second fault propagation path simple retrieval means for tracing, in an input direction, a signal line along which there is a possibility that a fault state will propagate to an undetermined gate, while referring to expected values of signal lines and to gate function, from an undetermined gate whose output signal is faulty and whose input/output signal lines have a signal line the logic state of which is unknown, and registering the traced signal line as a fault propagation path.

24. The system as defined in claim 23, wherein said decision-limit altering means includes:

decision-limit reset condition discrimination means for deciding beforehand an upper-limit value on inference processing time as the decision-limit reset condition, and discriminating whether the inference processing time has exceeded the upper limit on inference processing time;

decision-limit resetting means for resetting a decision limit value if the decision-limit reset condition has been satisfied; and backtrack means which, if the number of decisions exceeds the decision limit value reset by said decision-limit resetting means, is for erasing the logic state of a decision level for which inference processing has already ended, a history of implications as well as logic contradictions, and restoring the logic state of each signal line to a logic state that prevailed before the number of decisions exceeded the decision limit value.

25. In a system for inferring a logic state in a combinational logic circuit by repeating logic state decisions and implications and comparing the logic state with an expected value, which is a logic state that prevails when the combinational logic circuit operates normally, thereby inferring a fault propagation path in the combinational logic circuit, a system for resetting a decision limit, comprising:

decision-limit reset condition discrimination means for deciding beforehand an upper-limit value on inference processing time as the decision-limit reset condition, and discriminating whether the inference processing time has exceeded the upper limit on inference processing time;

decision-limit resetting means for resetting a decision limit value if the decision-limit reset condition has been satisfied; and backtrack means which, if the number of decisions exceeds the decision limit value reset by said decision-limit resetting means, is for erasing the logic state of a decision level for which inference processing has already ended, a history of implications as well as logic contradictions, and restoring the logic state of each signal line to a logic state that prevailed before the number of decisions exceeded the decision limit value.

26. A fault propagation path inferring method of inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, comprising the steps of:

deciding beforehand an upper-limit value on inference processing time as a decision-limit reset condition, and discriminating whether the inference processing time has exceeded the upper limit on inference processing time;

resetting a decision limit value if the decision-limit reset condition has been satisfied; and if the number of decisions exceeds the decision limit value reset at said decision-limit resetting step, is for erasing the logic state of a decision level for which inference processing has already ended, a history of implications as well as logic contradictions, and restoring the logic state of each signal line to a logic state that prevailed before the number of decisions exceeded the decision limit value.

27. A computer program for causing a computer to execute fault propagation path inferring processing for inferring a logic state in a combinational logic circuit by repeating logic state decisions and implications and comparing the logic state with an expected value, which corresponds to a logic state that prevails when the combinational logic circuit operates normally, thereby inferring a fault propagation path in the combinational logic circuit, said program causing the computer to execute the following processing:

decision-limit reset condition discriminating processing for deciding beforehand an upper-limit value on inference processing time as a decision-limit reset condition, and discriminating whether the inference processing time has exceeded the upper limit on inference processing time;

decision-limit resetting processing for resetting a decision limit value if the decision-limit reset condition has been satisfied; and backtrack processing which, if the number of decisions exceeds the decision limit value reset by said decision-limit resetting processing, is processing for erasing the logic state of a decision level for which inference processing has already ended, a history of implications as well as logic contradictions, and restoring the logic state of each signal line to a logic state that prevailed before the number of decisions exceeded the decision limit value.

* * * * *